United States Patent
Clarke et al.

(10) Patent No.: US 9,356,011 B2
(45) Date of Patent: May 31, 2016

(54) JUNCTION-ISOLATED BLOCKING VOLTAGE STRUCTURES WITH INTEGRATED PROTECTION STRUCTURES

(71) Applicant: Analog Devices, Inc., Norwood, MA (US)

(72) Inventors: David J. Clarke, Patrickswell (IE); Javier Alejandro Salcedo, North Billerica, MA (US); Brian B. Moane, Raheen (IE); Juan Luo, San Jose, CA (US); Seamus Murnane, Bruff (IE); Kieran K. Heffernan, Patrickswell (IE); John Twomey, Fountainstown (IE); Stephen Denis Heffernan, Tipperary (IE); Gavin Patrick Cosgrave, Wexford (IE)

(73) Assignee: ANALOG DEVICES, INC., Norwood, MA (US)

( * ) Notice: Subject to any disclaimer, the term of this patent is extended or adjusted under 35 U.S.C. 154(b) by 121 days.

(21) Appl. No.: 14/446,205

(22) Filed: Jul. 29, 2014

(65) Prior Publication Data

US 2014/0332843 A1    Nov. 13, 2014

Related U.S. Application Data

(63) Continuation of application No. 13/682,284, filed on Nov. 20, 2012, now Pat. No. 8,796,729.

(51) Int. Cl.
*H01L 29/747* (2006.01)
*H01L 27/02* (2006.01)
(Continued)

(52) U.S. Cl.
CPC ........ *H01L 27/0248* (2013.01); *H01L 27/0635* (2013.01); *H01L 27/0647* (2013.01);
(Continued)

(58) Field of Classification Search
CPC ............ H01L 27/0248; H01L 27/0647; H01L 27/0635; H01L 29/747; H01L 29/7412
USPC .......................................... 257/173–176, 355
See application file for complete search history.

(56) References Cited

U.S. PATENT DOCUMENTS 3,436,667 A    4/1969 Kedson
4,633,283 A    12/1986 Avery
(Continued)

FOREIGN PATENT DOCUMENTS

DE    10 2007 040 875 A1    3/2009
EP           0 168 678 A2    1/1986
(Continued)

OTHER PUBLICATIONS

Salcedo et al., *Bidirectional Devices for Automotive-Grade Electrostatic Discharge Applications*, IEEE Electron Device Letters, vol. 33, No. 6, Jun. 2012, 3 pages.
(Continued)

*Primary Examiner* — Cuong Q Nguyen
(74) *Attorney, Agent, or Firm* — Knobbe Martens Olson & Bear LLP

(57) ABSTRACT

Junction-isolated blocking voltage devices and methods of forming the same are provided. In certain implementations, a blocking voltage device includes an anode terminal electrically connected to a first p-well, a cathode terminal electrically connected to a first n-well, a ground terminal electrically connected to a second p-well, and an n-type isolation layer for isolating the first p-well from a p-type substrate. The first p-well and the first n-well operate as a blocking diode. The blocking voltage device further includes a PNPN silicon controlled rectifier (SCR) associated with a P+ region formed in the first n-well, the first n-well, the first p-well, and an N+ region formed in the first p-well. Additionally, the blocking voltage device further includes an NPNPN bidirectional SCR associated with an N+ region formed in the first p-well, the first p-well, the n-type isolation layer, the second p-well, and an N+ region formed in the second p-well.

21 Claims, 21 Drawing Sheets

(51) Int. Cl.
   *H01L 29/66* (2006.01)
   *H01L 29/06* (2006.01)
   *H01L 27/06* (2006.01)
   *H01L 29/74* (2006.01)

(52) U.S. Cl.
   CPC ...... *H01L29/0692* (2013.01); *H01L 29/66386* (2013.01); *H01L 29/747* (2013.01); *H01L 29/7412* (2013.01)

(56) References Cited

U.S. PATENT DOCUMENTS

| | | | |
|---|---|---|---|
| 5,061,652 A | 10/1991 | Bendernagel et al. | |
| 5,276,582 A | 1/1994 | Merrill et al. | |
| 5,341,005 A | 8/1994 | Canclini | |
| 5,343,053 A | 8/1994 | Avery | |
| 5,541,801 A | 7/1996 | Lee et al. | |
| 5,576,557 A | 11/1996 | Ker et al. | |
| 5,615,074 A | 3/1997 | Avery | |
| 5,652,689 A | 7/1997 | Yuan | |
| 5,663,860 A | 9/1997 | Swonger | |
| 5,742,084 A | 4/1998 | Yu | |
| 5,745,323 A | 4/1998 | English et al. | |
| 5,781,389 A | 7/1998 | Fukuzako et al. | |
| 5,786,617 A | 7/1998 | Merrill et al. | |
| 5,889,644 A | 3/1999 | Schoenfeld et al. | |
| 5,895,940 A | 4/1999 | Kim | |
| 5,998,813 A | 12/1999 | Bernier | |
| 6,097,068 A | 8/2000 | Brown et al. | |
| 6,137,140 A | 10/2000 | Efland et al. | |
| 6,144,542 A | 11/2000 | Ker et al. | |
| 6,236,087 B1 | 5/2001 | Daly et al. | |
| 6,258,634 B1 | 7/2001 | Wang et al. | |
| 6,310,379 B1 | 10/2001 | Andresen et al. | |
| 6,329,694 B1 | 12/2001 | Lee et al. | |
| 6,403,992 B1 | 6/2002 | Wei | |
| 6,404,261 B1 | 6/2002 | Grover et al. | |
| 6,423,987 B1 | 7/2002 | Constapel et al. | |
| 6,512,662 B1 | 1/2003 | Wang | |
| 6,590,273 B2 | 7/2003 | Okawa et al. | |
| 6,621,126 B2 | 9/2003 | Russ | |
| 6,665,160 B2 | 12/2003 | Lin et al. | |
| 6,667,870 B1 | 12/2003 | Segervall | |
| 6,704,180 B2 | 3/2004 | Tyler et al. | |
| 6,724,603 B2 | 4/2004 | Miller et al. | |
| 6,756,834 B1 | 6/2004 | Tong et al. | |
| 6,765,771 B2 | 7/2004 | Ker et al. | |
| 6,768,616 B2 | 7/2004 | Mergens et al. | |
| 6,870,202 B2 | 3/2005 | Oka | |
| 6,960,792 B1 | 11/2005 | Nguyen | |
| 6,960,811 B2 | 11/2005 | Wu et al. | |
| 6,979,869 B2 | 12/2005 | Chen et al. | |
| 7,034,363 B2 | 4/2006 | Chen | |
| 7,038,280 B2 | 5/2006 | Righter | |
| 7,071,528 B2 | 7/2006 | Ker et al. | |
| 7,125,760 B1 | 10/2006 | Reese et al. | |
| 7,232,705 B2 | 6/2007 | Righter | |
| 7,232,711 B2 | 6/2007 | Gambino et al. | |
| 7,335,543 B2 | 2/2008 | Chen et al. | |
| 7,345,341 B2 | 3/2008 | Lin et al. | |
| 7,385,793 B1 | 6/2008 | Ansel et al. | |
| 7,436,640 B2 | 10/2008 | Su et al. | |
| 7,566,914 B2 | 7/2009 | Salcedo et al. | |
| 7,570,467 B2 | 8/2009 | Watanabe et al. | |
| 7,601,991 B2 | 10/2009 | Salcedo et al. | |
| 7,663,190 B2 | 2/2010 | Vinson | |
| 7,714,357 B2 | 5/2010 | Hayashi et al. | |
| 7,834,378 B2 | 11/2010 | Ryu et al. | |
| 7,910,999 B2 | 3/2011 | Lee et al. | |
| 7,969,006 B2 | 6/2011 | Lin et al. | |
| 8,044,457 B2 | 10/2011 | Salcedo et al. | |
| 8,198,651 B2 | 6/2012 | Langguth et al. | |
| 8,222,698 B2 | 7/2012 | Salcedo et al. | |
| 8,331,069 B2 | 12/2012 | Galy et al. | |
| 8,368,116 B2 | 2/2013 | Salcedo et al. | |
| 8,416,543 B2 | 4/2013 | Salcedo | |
| 8,432,651 B2 | 4/2013 | Salcedo et al. | |
| 8,466,489 B2 | 6/2013 | Salcedo et al. | |
| 8,553,380 B2 | 10/2013 | Salcedo | |
| 8,592,860 B2 | 11/2013 | Salcedo et al. | |
| 8,610,251 B1 * | 12/2013 | Salcedo | H01L 29/747 257/173 |
| 8,633,509 B2 | 1/2014 | Salcedo | |
| 8,637,899 B2 | 1/2014 | Salcedo | |
| 8,665,571 B2 | 3/2014 | Salcedo et al. | |
| 8,680,620 B2 | 3/2014 | Salcedo et al. | |
| 8,772,091 B2 * | 7/2014 | Salcedo | H01L 21/8222 257/140 |
| 8,796,729 B2 | 8/2014 | Clarke et al. | |
| 8,890,248 B2 * | 11/2014 | Pauletti | H01L 27/0262 257/173 |
| 8,963,200 B2 * | 2/2015 | Lee | H01L 29/73 257/147 |
| 2001/0040254 A1 | 11/2001 | Takiguchi | |
| 2002/0021538 A1 | 2/2002 | Chen et al. | |
| 2002/0081783 A1 | 6/2002 | Lee et al. | |
| 2002/0109190 A1 | 8/2002 | Ker et al. | |
| 2002/0122280 A1 | 9/2002 | Ker et al. | |
| 2002/0153571 A1 | 10/2002 | Mergens et al. | |
| 2002/0187601 A1 | 12/2002 | Lee et al. | |
| 2003/0038298 A1 | 2/2003 | Cheng et al. | |
| 2003/0076636 A1 | 4/2003 | Ker et al. | |
| 2004/0135229 A1 | 7/2004 | Sasahara | |
| 2004/0164354 A1 | 8/2004 | Mergens et al. | |
| 2004/0190208 A1 | 9/2004 | Levit | |
| 2004/0207021 A1 | 10/2004 | Russ et al. | |
| 2004/0240128 A1 | 12/2004 | Boselli et al. | |
| 2005/0012155 A1 | 1/2005 | Ker et al. | |
| 2005/0082618 A1 | 4/2005 | Wu et al. | |
| 2005/0087807 A1 | 4/2005 | Righter | |
| 2005/0088794 A1 | 4/2005 | Boerstler et al. | |
| 2005/0093069 A1 | 5/2005 | Logie | |
| 2005/0133869 A1 | 6/2005 | Ker et al. | |
| 2005/0151160 A1 | 7/2005 | Salcedo et al. | |
| 2005/0195540 A1 | 9/2005 | Streibl et al. | |
| 2006/0033163 A1 | 2/2006 | Chen | |
| 2006/0109595 A1 | 5/2006 | Watanabe et al. | |
| 2006/0145260 A1 | 7/2006 | Kim | |
| 2006/0186467 A1 | 8/2006 | Pendharkar et al. | |
| 2007/0007545 A1 | 1/2007 | Salcedo et al. | |
| 2007/0058307 A1 | 3/2007 | Mergens et al. | |
| 2007/0158748 A1 | 7/2007 | Chu et al. | |
| 2008/0044955 A1 | 2/2008 | Salcedo et al. | |
| 2008/0067601 A1 | 3/2008 | Chen | |
| 2008/0203534 A1 | 8/2008 | Xu et al. | |
| 2009/0032838 A1 | 2/2009 | Tseng et al. | |
| 2009/0034137 A1 | 2/2009 | Disney et al. | |
| 2009/0045457 A1 | 2/2009 | Bodbe | |
| 2009/0057715 A1 | 3/2009 | Ryu et al. | |
| 2009/0206376 A1 | 8/2009 | Mita et al. | |
| 2009/0230426 A1 | 9/2009 | Carpenter et al. | |
| 2009/0236631 A1 | 9/2009 | Chen et al. | |
| 2009/0309128 A1 | 12/2009 | Salcedo et al. | |
| 2010/0133583 A1 | 6/2010 | Mawatari et al. | |
| 2010/0163973 A1 | 7/2010 | Nakamura et al. | |
| 2010/0327343 A1 | 12/2010 | Salcedo et al. | |
| 2011/0101444 A1 | 5/2011 | Coyne et al. | |
| 2011/0110004 A1 | 5/2011 | Maier | |
| 2011/0176244 A1 | 7/2011 | Gendron et al. | |
| 2011/0207409 A1 | 8/2011 | Ker et al. | |
| 2011/0284922 A1 | 11/2011 | Salcedo et al. | |
| 2011/0303947 A1 | 12/2011 | Salcedo et al. | |
| 2011/0304944 A1 | 12/2011 | Salcedo et al. | |
| 2012/0199874 A1 | 8/2012 | Salcedo et al. | |
| 2012/0205714 A1 | 8/2012 | Salcedo et al. | |
| 2012/0293904 A1 | 11/2012 | Salcedo et al. | |
| 2013/0208385 A1 | 8/2013 | Salcedo et al. | |
| 2013/0234209 A1 | 9/2013 | Parthasarathy et al. | |
| 2013/0242448 A1 | 9/2013 | Salcedo et al. | |

(56) References Cited

U.S. PATENT DOCUMENTS

| | | |
|---|---|---|
| 2013/0270605 A1 | 10/2013 | Salcedo et al. |
| 2013/0330884 A1 | 12/2013 | Salcedo et al. |
| 2014/0138735 A1 | 5/2014 | Clarke et al. |
| 2014/0167104 A1 | 6/2014 | Salcedo |
| 2014/0167105 A1 | 6/2014 | Salcedo et al. |
| 2014/0167106 A1 | 6/2014 | Salcedo |

FOREIGN PATENT DOCUMENTS

| | | |
|---|---|---|
| EP | 1 703 560 A2 | 9/2006 |
| KR | 10-2006-0067100 | 2/2006 |
| KR | 10-2009-0123683 | 12/2009 |
| KR | 10-2010-0003569 | 1/2010 |

OTHER PUBLICATIONS

Anderson et al., *ESD Protection under Wire Bonding Pads*, EOS/ESD Symposium 99-88, pp. 2A.4.1-2A.4.7 (1999).

Luh et al. *A Zener-Diode-Activated ESD Protection Circuit for Sub-Micron CMOS Processes*, Circuits and Systems, IEEE International Symposium, May 28-31, 2000, Geneva, Switzerland, 4 pages.

Salcedo et al., *Electrostatic Discharge Protection Framework for Mixed-Signal High Voltage CMOS Applications*, IEEE Xplore, downloaded Feb. 23, 2010 at 12:53 EST, 4 pages.

Chang et al., *High-k Metal Gate-bounded Silicon Controlled Rectifier for ESD Protection*, 34th Electrical Overstress/Electrostatic Discharge Symposium, Sep. 2012, 7 pages.

Salcedo et al., *On-Chip Protection for Automotive Integrated Circuits Robustness*, 2012 8th International Caribbean Conference on Devices, Circuits and Systems (ICCDCS), 5 pages, Mar. 2012.

* cited by examiner

JUNCTION-ISOLATED BLOCKING VOLTAGE STRUCTURES WITH INTEGRATED PROTECTION STRUCTURES

CROSS-REFERENCE TO RELATED APPLICATIONS

This application is a continuation of U.S. application Ser. No. 13/682,284, filed Nov. 20, 2012, titled "JUNCTION-ISOLATED BLOCKING VOLTAGE DEVICES WITH INTEGRATED PROTECTION STRUCTURES AND METHODS OF FORMING THE SAME", now U.S. Pat. No. 8,796,729, the entire disclosure of which is hereby incorporated herein by reference.

BACKGROUND

1. Field

Embodiments of the invention relate to electronic systems, and more particularly, to protection systems for integrated circuits (ICs).

2. Description of the Related Technology

Certain electronic systems can be exposed to a transient electrical event, or an electrical signal of a relatively short duration having rapidly changing voltage and high power. Transient electrical events can include, for example, electrostatic discharge (ESD) events and/or electromagnetic interference (EMI) events.

Transient electrical events can damage integrated circuits (ICs) inside an electronic system due to overvoltage conditions and/or high levels of power dissipation over relatively small areas of the ICs. High power dissipation can increase IC temperature, and can lead to numerous problems, such as gate oxide punch-through, junction damage, metal damage, and surface charge accumulation. Moreover, transient electrical events can induce latch-up (in other words, inadvertent creation of a low-impedance path), thereby disrupting the functioning of the IC and potentially causing permanent damage to the IC. Thus, there is a need to provide an IC with protection from such transient electrical events, such as during IC power-up and power-down conditions.

SUMMARY

In one embodiment, an apparatus includes a p-type substrate, a first p-type well disposed in the p-type substrate, a first n-type well disposed in the p-type substrate adjacent the first p-type well, a second p-type well disposed in the p-type substrate, and an n-type isolation layer beneath the first p-type well, the second n-type well, and at least a portion of the second p-type well. The first p-type well includes at least one p-type active region and at least one n-type active region electrically connected to a first terminal. Additionally, the first n-type well includes at least one p-type active region and at least one n-type active region electrically connected to a second terminal. Furthermore, the second p-type well includes at least one p-type active region and at least one n-type active region electrically connected to a third terminal. The first p-type well and the first n-type well are configured to operate as a blocking diode. Additionally, the at least one p-type active region of the first n-type well, the first n-type well, the first p-type well, and the at least one n-type active region of the first p-type well are configured to operate as a PNPN silicon controlled rectifier. Furthermore, the at least one n-type active region of the first p-type well, the first p-type well, the n-type isolation layer, the second p-type well, and the at least one n-type active region of the second p-type well are configured to operate as an NPNPN bidirectional silicon controlled rectifier.

In another embodiment, an apparatus includes a blocking diode, a first PNP bipolar transistor, a first NPN bipolar transistor, a second NPN bipolar transistor, and a bidirectional PNP bipolar transistor. The blocking diode includes an anode electrically connected to a first terminal and a cathode electrically connected to a second terminal. Additionally, the first PNP bipolar transistor includes an emitter electrically connected to the second terminal, a base, and a collector. Furthermore, the first NPN bipolar transistor includes an emitter electrically connected to the first terminal, a base electrically connected to the collector of the first PNP bipolar transistor, and a collector electrically connected to the base of the first PNP bipolar transistor. Additionally, the second NPN bipolar transistor includes an emitter electrically connected to a third terminal, a base, and a collector. Furthermore, the bidirectional PNP bipolar transistor includes an emitter/collector electrically connected to the base of the second NPN bipolar transistor, a collector/emitter eclectically connected to the base of the first NPN bipolar transistor, and a base electrically connected to the collectors of the first and second NPN bipolar transistors. The first PNP bipolar transistor and the first NPN bipolar transistor are configured to operate as a PNPN silicon controlled rectifier. Additionally, the first NPN bipolar transistor, the bidirectional PNP bipolar transistor, and the second NPN bipolar transistor are configured to operate as an NPNPN bidirectional silicon controlled rectifier.

In another embodiment, a method of making a blocking device is provided. The method includes forming a first p-type well in a p-type substrate, forming at least one p-type active region and at least one n-type active region in the first p-type well, forming a first n-type well in the p-type substrate adjacent the first p-type well, forming at least one p-type active region and at least one n-type active region in the first n-type well, forming a second p-type well in the p-type substrate, forming at least one p-type active region and at least one n-type active region in the second p-type well, and forming an n-type isolation layer beneath the first p-type well, the second n-type well, and at least a portion of the second p-type well. The first p-type well and the first n-type well are configured to operate as a blocking diode. Additionally, the at least one p-type active region of the first n-type well, the first n-type well, the first p-type well, and the at least one n-type active region of the first p-type well are configured to operate as a PNPN silicon controlled rectifier. Furthermore, the at least one n-type active region of the first p-type well, the first p-type well, the n-type isolation layer, the second p-type well, and the at least one n-type active region of the second p-type well are configured to operate as an NPNPN bidirectional silicon controlled rectifier.

DETAILED DESCRIPTION OF EMBODIMENTS

Figure 1:
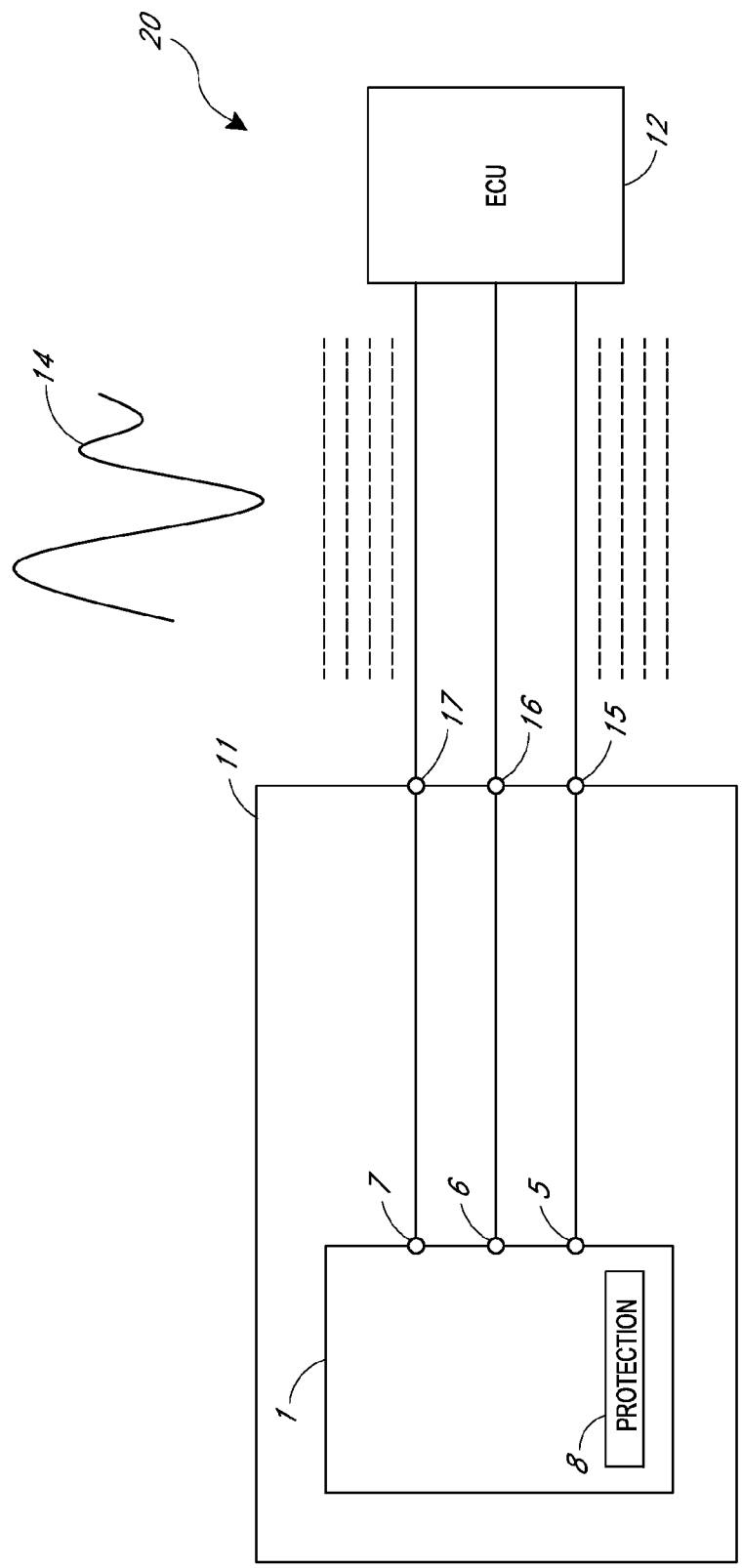
FIG. 1 is a schematic block diagram of one example of an electronic system.

The following detailed description of embodiments presents various descriptions of specific embodiments of the invention. However, the invention can be embodied in a multitude of different ways as defined and covered by the claims. In this description, reference is made to the drawings where like reference numerals indicate identical or functionally similar elements.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader. In the embodiments described below, p-type regions can include a p-type semiconductor material, such as boron, as a dopant. Further, n-type regions can include an n-type semiconductor material, such as phosphorous, as a dopant. A skilled artisan will appreciate various concentrations of dopants in regions described below.

Overview of Junction-Isolated Blocking Voltage Devices

To help assure that an electronic system is reliable, manufacturers can test the electronic system under defined stress conditions, which can be described by standards set by various organizations, such as the Joint Electronic Device Engineering Council (JEDEC), the International Electrotechnical Commission (IEC), the Automotive Engineering Council (AEC), and the International Organization for Standardization (ISO). The standards can cover a wide multitude of transient electrical events as discussed above, including electrostatic discharge (ESD) events and/or electromagnetic interference (EMI) events.

Electronic circuit reliability is enhanced by providing protection devices to the pads of an IC. The protection devices can maintain the voltage level at the pads within a predefined safe range by transitioning from a high-impedance state to a low-impedance state when the voltage of the transient signal reaches a trigger voltage. Thereafter, the protection device can shunt at least a portion of the current associated with the transient signal before the voltage of the transient signal reaches a positive or negative failure voltage that can lead to one of the most common causes of IC damage.

There is a need for providing protection to circuitry within an IC before a protection device activates. For example, the protection device can be optimized to sustain ESD and/or EMI stress conditions that can occur between pads associated with a high voltage interface, but can have a finite turn-on time. Absent additional protection, certain interface circuitry such as blocking diodes can become damaged by transient stress conditions that occur before the protection device activates. Accordingly, there is a need for blocking voltage devices that can be smaller and faster than the protection device, and that include integrated protection structures that provide additional discharge paths to render protection against stress conditions before the protection device activates, thereby protecting the blocking voltage device and/or interface circuitry that includes the blocking voltage device from overstress beyond safe operating conditions.

In certain implementations, a junction-isolated blocking voltage device including an integrated protection structure is provided. The blocking voltage device is disposed in a p-type substrate, and includes an anode terminal electrically connected to a first p-well, a cathode terminal electrically connected to a first n-well, a ground terminal electrically connected to a second p-well, and an n-type isolation layer disposed beneath the first p-well, the first n-well, and at least a portion of the second p-well. The first p-well and the first n-well operate as a blocking diode, which can become forward biased when a voltage of the anode terminal is greater than a voltage of the cathode terminal. Additionally, when the voltage of the cathode terminal is less than the voltage of the anode terminal, the blocking diode can become reversed biased and provide a relatively high blocking voltage of, for example, about 70 V or more. For very large reverse bias voltages associated with ESD and/or EMI events, the integrated protection structure can activate to prevent the blocking diode from damage due to reverse breakdown. In certain implementations, the integrated protection structure includes a PNPN silicon controlled rectifier (SCR) associated with at least one P+ region disposed in the first n-well, the first n-well, the first p-well, and at least one N+ region disposed in the first p-well.

The blocking voltage device's ground terminal can be used to provide enhanced isolation between the blocking diode and the p-type substrate, thereby increasing robustness against latch-up. For example, the ground terminal can be used to collect carriers injected into the p-type substrate during an ESD and/or EMI event received between the anode terminal and the cathode terminal. In certain implementations, the integrated protection structure further includes an NPNPN bidirectional SCR between the ground terminal and the anode terminal that can be used to protect the blocking voltage device from transient electrical events received between the anode terminal and the ground terminal. For example, in certain implementations the NPNPN bidirectional SCR is associated with at least one N+ region disposed in the first p-well, the first p-well, the n-type isolation layer, the second p-well, and at least one N+ region disposed in the second p-well. The NPNPN bidirectional SCR can protect sensitive junctions and devices from activating during ESD and/or EMI events. For example, the NPNPN bidirectional SCR can be used to protect a parasitic diode associated with the n-type isolation layer and the p-type substrate and/or a parasitic PNP bipolar transistor associated with the first p-well, the n-type isolation layer, and the p-type substrate.

The junction-isolated blocking voltage device can be used to enhance the latch-up robustness of an IC including the blocking voltage device. The blocking voltage device can also aid in protecting parasitic substrate devices from damage during ESD and/or EMI conditions, which has been an industry-wide challenge for the implementation of interface circuits in junction-isolated processes, such as junction-isolated bipolar-CMOS-DMOS (BCD) processes. The blocking voltage devices can be used in a variety of applications, including local interconnect network (LIN) interfaces, controller area network (CAN) interfaces, FlexRay interfaces, RS-232 interfaces, RS-485 interfaces, and/or A2B interfaces.

FIG. 1 is a schematic block diagram of one example of an electronic system 20. The electronic system 20 includes a circuit board or card 11 and an engine control unit (ECU) 12. The circuit board 11 includes an IC 1, a first pin 15, a second pin 16, and a third pin 17. The IC 1 includes first to third pads 5-7 and a protection system 8.

The IC 1 and the ECU 12 can be electrically connected to one another so that signals can be communicated between the IC 1 and the ECU 12 and/or power can be provided to the IC 1. For example, the first to third pads 5-7 of the IC 1 can be electrically connected to the first to third pins 15-17 of the circuit board 11, respectively, which can be electrically connected to the ECU 12 using, for example, wires or cables. In certain implementations, the first pin 15 of the circuit board 11 is a power-low pin, the second pin 16 of the circuit board 11 is a signal pin, and the third pin 17 of the circuit board 11 is a power-high pin. However, other configurations are possible, including, for example, configurations using more or fewer pins.

Transient electrical events can occur in the electronic system 20 that can reach the IC 1. For example, ESD events and/or EMI events associated with inductive coupling of a wire harness used to electrically connect the circuit board 11 and the ECU 12 can result in the generation of a transient electrical event 14. The transient electrical event 14 can also be associated with user or machine handling of the IC 1, such as an ESD event defined by the AEC-Q100 specifications. The transient electrical event 14 can produce overvoltage or undervoltage conditions and can dissipate high levels of power, which can disrupt the functioning of the IC 1 and potentially cause permanent damage. As used herein, an "undervoltage condition" is a negative magnitude overvoltage condition.

The protection system 8 is configured to provide transient electrical event protection to the IC 1, thereby enhancing the range of applications that the IC 1 can be used in and/or the harshness of the electrical environment in which the IC 1 can operate. The protection system 8 can be used to ensure reliability of the IC 1 by maintaining the voltage level at the pads 5-7 of the IC 1 within a particular range of voltage, which can vary from pad to pad. The protection system 8 can be configured to divert a current associated with a transient electrical event received on a pad of the IC to other nodes or pads of the IC, thereby providing transient electrical event protection.

The electronic system 20 can represent, for example, a local interconnect network (LIN) protocol system, a controller area network (CAN) protocol system, a transmission line system, an industrial control system, a power management system, a microelectromechanical system (MEMS) sensor system, a transducer system, or a variety of other systems. In one embodiment, the electronic system 20 is an automotive interface system, and the IC 1 is a sensor signal conditioning IC for an automobile.

Figure 2:
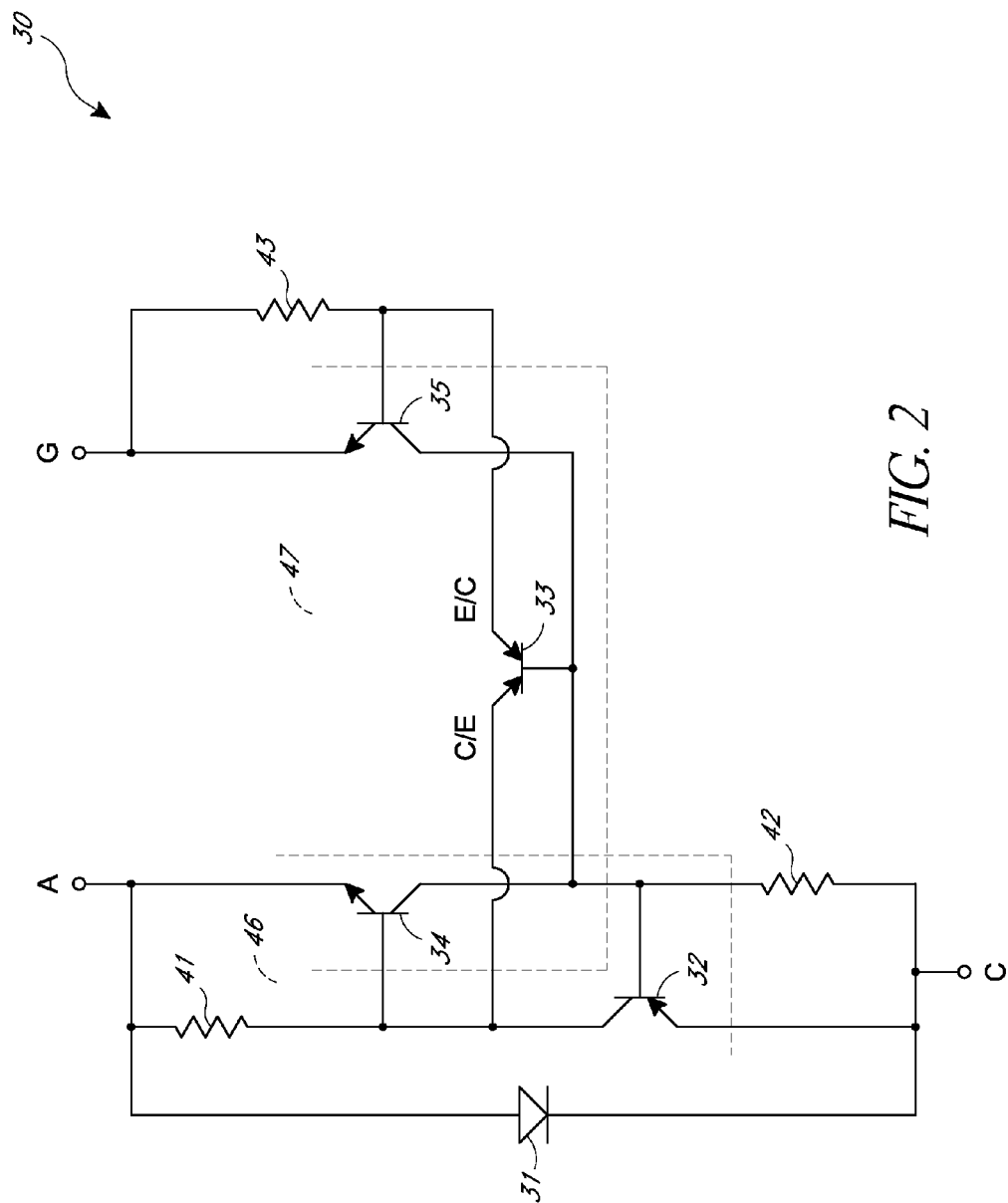
FIG. 2 is a circuit diagram of a blocking voltage circuit according to one embodiment.

FIG. 2 is a circuit diagram of a blocking voltage circuit 30 according to one embodiment. The blocking voltage circuit 30 includes a first or anode terminal A, a second or cathode terminal C, and a third or ground terminal G. The blocking voltage circuit 30 further includes a blocking diode 31, a first PNP bipolar transistor 32, a second or bidirectional PNP bipolar transistor 33, a first NPN bipolar transistor 34, a second NPN bipolar transistor 35, and first to third resistors 41-43.

The first NPN bipolar transistor 34 includes an emitter electrically connected to the anode terminal A, to a first end of the first resistor 41, and to an anode of the blocking diode 31. The first NPN bipolar transistor 34 further includes a base electrically connected to a collector/emitter C/E of the bidirectional PNP bipolar transistor 33, to a second end of the first resistor 41, and to a collector of the first PNP bipolar transistor 32. The first NPN bipolar transistor 34 further includes a collector electrically connected to a base of the first PNP bipolar transistor 32, to a base of the bidirectional PNP bipolar transistor 33, to a collector of the second NPN bipolar transistor 35, and to a first end of the second resistor 42. The first PNP bipolar transistor 32 further includes an emitter electrically connected to the cathode terminal C, to a cathode of the blocking diode 31, and to a second end of the second resistor 42. The second NPN bipolar transistor 35 further includes an emitter electrically connected to the ground terminal G and to a first end of the third resistor 43. The second NPN bipolar transistor 35 further includes a base electrically connected to an emitter/collector E/C of the bidirectional PNP bipolar transistor 33 and to a second end of the third resistor 43.

The bidirectional PNP bipolar transistor 33 operates bidirectionally, and the operation of the emitter/collector E/C and the collector/emitter C/E as emitter and collector can depend on the voltage conditions of the anode terminal A and the ground terminal G. For example, when a voltage of the anode terminal A is greater than a voltage of the ground terminal G, the collector/emitter C/E of the bidirectional PNP bipolar transistor 33 serves as an emitter and the emitter/collector E/C of the bidirectional PNP bipolar transistor 33 serves as a collector. In contrast, when the voltage of the anode terminal A is less than the voltage of the ground terminal G, the collector/emitter C/E of the bidirectional PNP bipolar transistor 33 serves as a collector and the emitter/collector E/C of the bidirectional PNP bipolar transistor 33 serves as an emitter.

During normal operating conditions between the anode terminal A and the cathode terminal C, the blocking voltage circuit 30 can operate similar to a high blocking voltage diode. For example, when a voltage of the anode terminal A is greater than a voltage of the cathode terminal C, the blocking diode 31 can become forward biased to provide the blocking voltage circuit 30 with a high forward conduction current handling capability. Additionally, when the voltage of the anode terminal A is less than the cathode terminal C, the blocking diode 31 can become reversed biased to provide the blocking voltage circuit 30 with a relatively high blocking voltage.

However, in contrast to a conventional blocking diode, the illustrated blocking voltage circuit 30 includes a built-in or integrated protection structure that can be used to protect the circuit from damage during overstress conditions.

For example, to protect the blocking diode 31 from damage from reverse breakdown during ESD and/or EMI events received between the anode terminal A and the cathode terminal C, the blocking voltage circuit 30 is configured to include a PNPN silicon controlled rectifier (SCR) 46 including the first PNP bipolar transistor 32 and the first NPN bipolar transistor 34. In particular, the first PNP bipolar transistor 32 and the first NPN bipolar transistor 34 are arranged as cross-coupled bipolar transistors in feedback such that an increase in the collector current of the first PNP bipolar transistor 32 increases the base current of the first NPN bipolar transistor 34 and an increase in the collector current of the first NPN bipolar transistor 34 increases the base current of the first PNP bipolar transistor 32. As the voltage difference between the cathode terminal C and the anode terminal A increases during a transient electrical event, the feedback between the first PNP bipolar transistor 32 and the first NPN bipolar transistor 34 can be regenerative and cause the PNPN SCR 46 to enter or transition into a low-impedance state. Thereafter, the feedback between the transistors can maintain the PNPN SCR 46 in the low-impedance state as long as the voltage difference between the cathode terminal C and the anode terminal A exceeds a forward holding voltage of the PNPN SCR 46.

The illustrated blocking voltage circuit 30 further includes an NPNPN bidirectional SCR 47 including the bidirectional PNP bipolar transistor 33 and the first and second NPN bipolar transistors 34, 35. The NPNPN bidirectional SCR 47 can aid in protecting the blocking voltage circuit 30 from damage when the blocking voltage circuit's anode terminal A is stressed relative to the ground terminal G. For example, the first NPN bipolar transistor 34 and the bidirectional PNP bipolar transistor 33 are cross-coupled and can be used to protect the blocking voltage circuit 30 from a transient electrical event that causes the voltage of the ground terminal G to increase relative to the voltage of the anode terminal A. Additionally, the second NPN bipolar transistor 35 and the bidirectional PNP bipolar transistor 33 are cross-coupled, and can be used to protect the blocking voltage circuit 30 from a transient electrical event that causes the voltage of the anode terminal A to increase relative to the voltage of the ground terminal G.

The PNPN SCR 46 and the NPNPN bidirectional SCR 47 can be configured to have a relatively high holding voltage relative to certain other protection circuits. Protecting the blocking diode 31 using a protection structure with a high holding voltage can mitigate the risk of latch-up during stress testing when an IC is powered.

The blocking voltage circuit's forward conduction characteristic between the anode terminal A and the cathode terminal C can be controlled using the blocking diode 31, such as by selection of the diode's size, geometry, and/or doping profile. Additionally, the reverse conduction characteristic between the anode terminal A and the cathode terminal C can be controlled by the gain and conduction strength of the first NPN bipolar transistor 34 and the first PNP bipolar transistor 32 as well as by selecting the resistance values of the first and second resistors 41, 42, which are disposed across the base-emitter junctions of the first NPN bipolar transistor 34 and the first PNP bipolar transistor 32, respectively, and can expedite turn-on during a transient electrical event. Furthermore, the forward and reverse conduction characteristics between the anode terminal A and the ground terminal G can be controlled by the gain and conduction strength of the first and second NPN bipolar transistors 34, 35 and the bidirectional PNP bipolar transistor 33 as well as by the resistance values of the first and third resistors 41, 43. In certain implementations, the operational characteristics of the bipolar transistors are controlled by selecting the size, spacing, and doping concentrations of active regions and wells associated with the transistors. Accordingly, fine-tuned control of the forward and reverse conduction characteristics of the blocking voltage circuit 30 can be provided, thereby enabling the blocking voltage circuit 30 to be implemented in precision interface signaling applications.

Figure 3A:
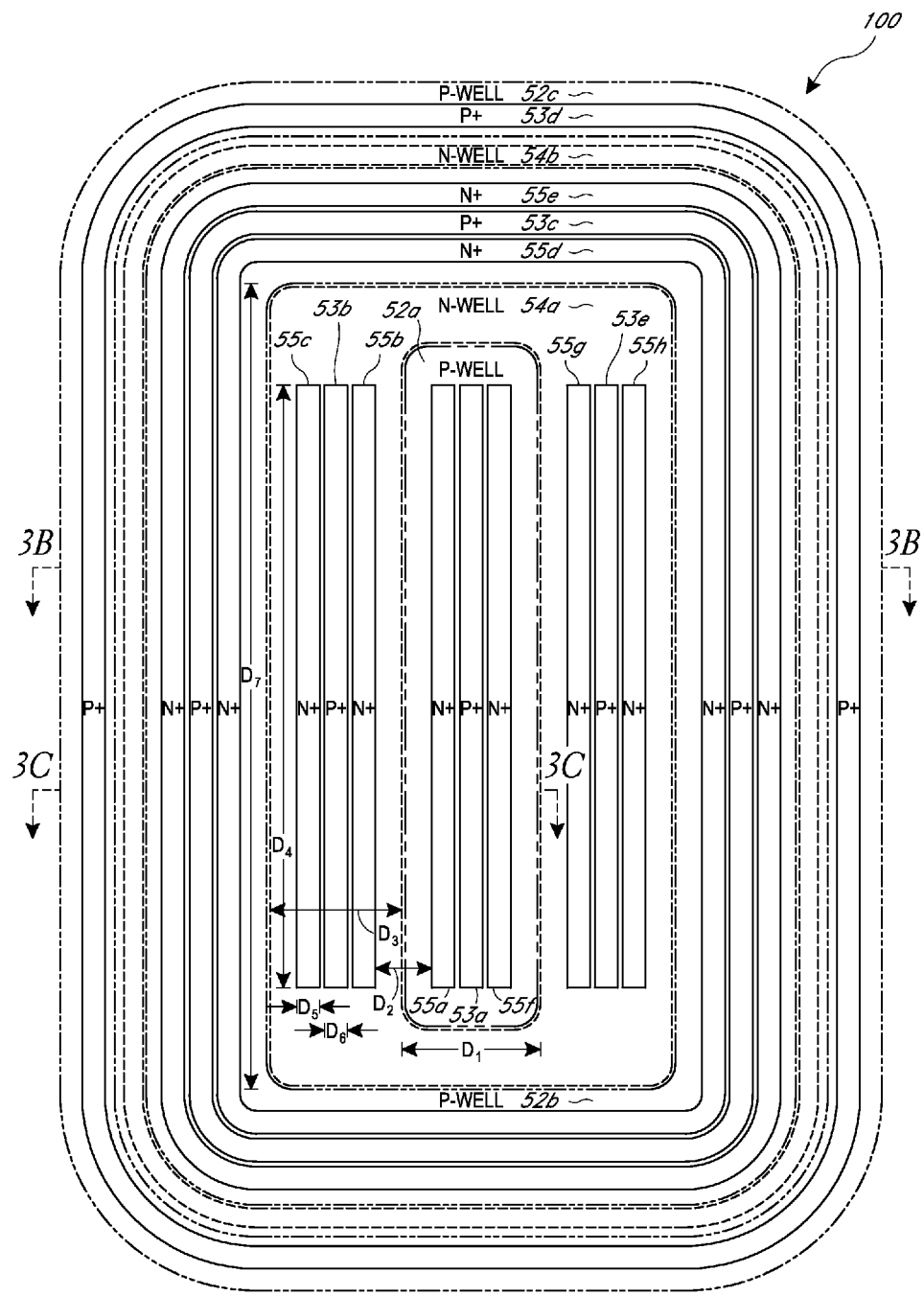
FIG. 3A is a top plan view of a junction-isolated blocking voltage device with an integrated protection structure according to one embodiment.
Figure 3B:
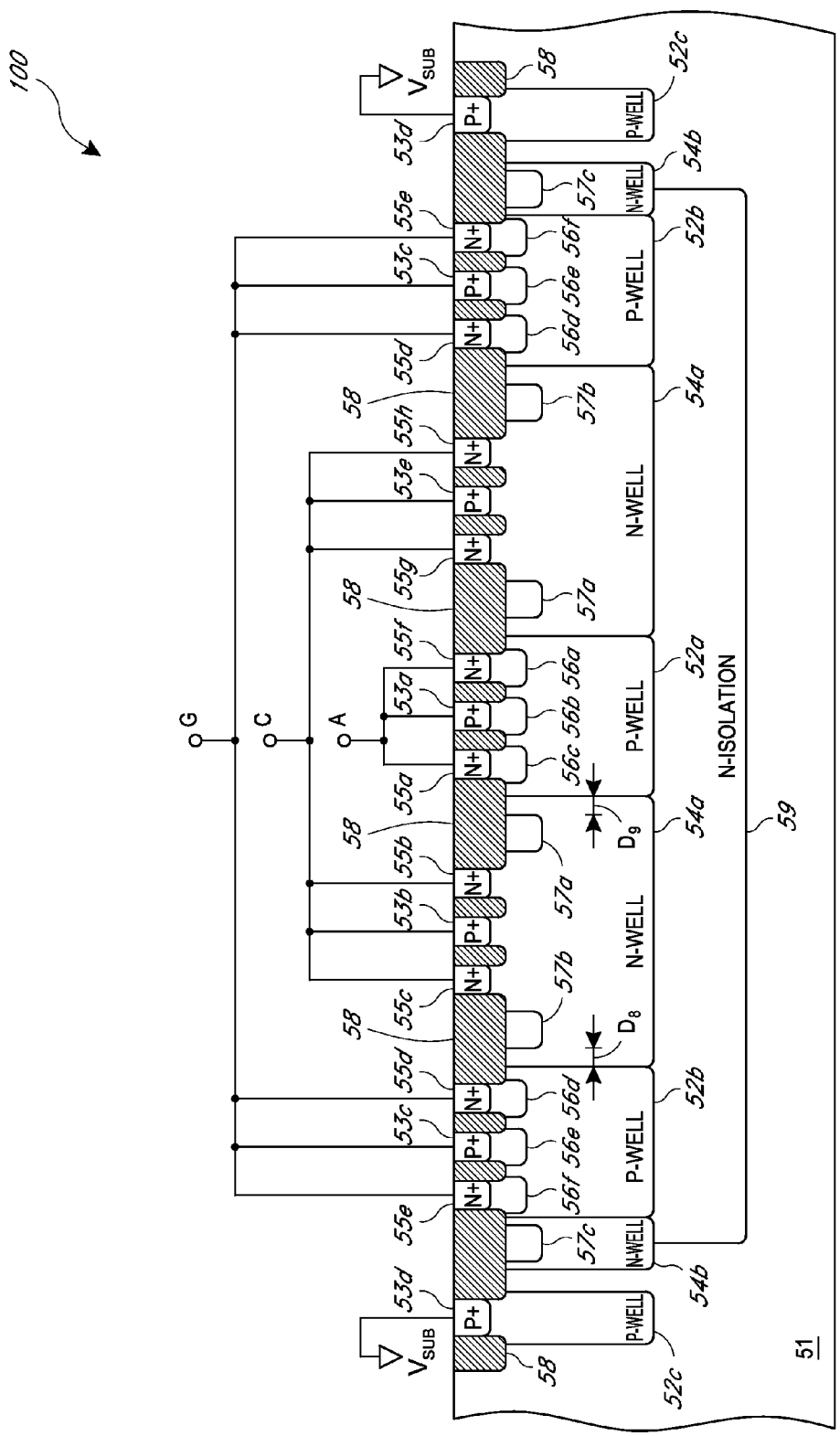
FIG. 3B is a cross section of the junction-isolated blocking voltage device of FIG. 3A taken along the lines 3B-3B of FIG. 3A.
Figure 3C:
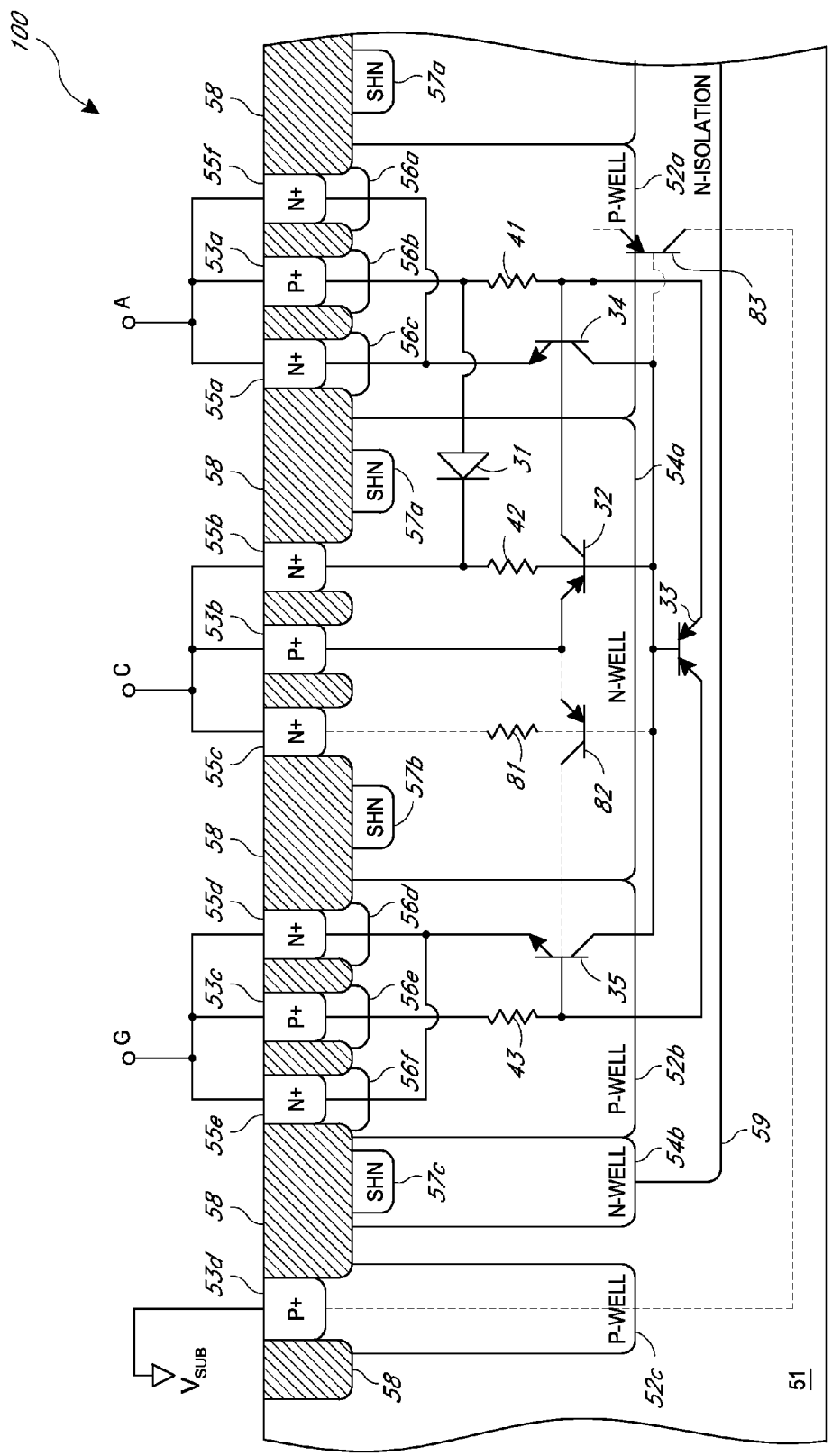
FIG. 3C is an annotated cross section of the junction-isolated blocking voltage device of FIG. 3B taken along the lines 3C-3C of FIG. 3A.

FIG. 3A is a top plan view of a junction-isolated blocking voltage device 100 with an integrated protection structure according to one embodiment. FIG. 3B is a cross section of the junction-isolated blocking voltage device 100 of FIG. 3A taken along the lines 3B-3B of FIG. 3A. FIG. 3C is an annotated cross section of the junction-isolated blocking voltage device 100 of FIG. 3B taken along the lines 3C-3C of FIG. 3A.

The blocking voltage device 100 is formed in a p-type substrate 51, and includes first to third p-wells 52a-52c, first to fifth p-type active regions or P+ regions 53a-53e, first and second n-wells 54a, 54b, first to eighth n-type active regions or N+ regions 55a-55h, first to sixth shallow p-type regions 56a-56f, first to third shallow n-type regions 57a-57c, oxide regions 58, and an n-type isolation layer 59. For purposes of clarity, only the first and second n-wells 54a, 54b, the first to third p-wells 52a-52c, the first to fifth P+ regions 53a-53e, and the first to eighth N+ regions 55a-55h are illustrated in the top plan view of FIG. 3A.

As shown in FIG. 3A, the first n-well 54a is configured as a first ring that surrounds and abuts the first p-well 52a such that the first p-well 52a is an island in the first n-well 54a. Additionally, the second p-well 52b is configured as a second ring that surrounds and abuts the first n-well 54a. Furthermore, the second n-well 54b is configured as a third ring that surrounds and abuts the second p-well 52b. Additionally, the third p-well 52c is configured as a fourth ring that surrounds but does not abut the second n-well 54b. The first P+ region 53a and the first and sixth N+ regions 55a, 55f are formed in the first p-well 52a with the first P+ region 53a disposed between the first and sixth N+ regions 55a, 55f. The second P+ region 53b and the second and third N+ regions 55b, 55c are formed in the first n-well 54a adjacent a first side of the first p-well 52a, and the fifth P+ region 53e and the seventh and eighth N+ regions 55g, 55h are formed in the first n-well 54a adjacent a second side of the first p-well 52a that is opposite the first side. As shown in FIG. 3A, the second P+ region 53b is disposed between the second and third N+ regions 55b, 55c, and the fifth P+ region 53e is disposed between the seventh and eighth N+ regions 55g, 55h. Additionally, the first, second and fifth P+ regions 53a, 53b, 53e and the first to third and sixth to eighth N+ regions 55a-55c, 55f-55h have been configured to extend along a first or vertical direction of the blocking voltage device 100, which can aid in directing current flow or conduction in a second or horizontal direction of the blocking voltage device 100. The third P+ region 53c and the fourth and fifth N+ regions 55d, 55e are formed as a ring in the second p-well 52b with the third P+ region 53c disposed between the fourth and fifth N+ regions 55d, 55e. The fourth P+ region 53d is formed as a ring in the third p-well 52c.

The first to third shallow p-type regions 56a-56c are formed beneath the sixth N+ region 55f, the first P+ region 53a, and the first N+ region 55a, respectively. Additionally, the fourth to sixth shallow p-type regions 56d-56f are formed beneath the fourth N+ region 55d, the third P+ region 53c, and the fifth N+ region 55e, respectively. Furthermore, the first shallow n-type region 57a is formed in the first n-well 54a between the second N+ region 55b and the first p-well 52a. Additionally, the second shallow n-type region 57b is formed in the first n-well 54a between the third N+ region 55c and the second p-well 52b. Furthermore, the third shallow n-type region 57c is formed in the second n-well 54b. Additionally, the n-type isolation layer 59 is disposed beneath the first p-well 52a, the first n-well 54a, the second p-well 52b, and beneath a portion of the second n-well 54b.

In the illustrated configuration, the blocking voltage device 100 is formed directly in the p-type substrate 51. However, the teachings herein are applicable to other configurations, such as implementations in which the p-type substrate includes a p-type epitaxial layer over a doped or undoped substrate region, and the blocking voltage device 100 is formed in the p-type epitaxial layer. Although not illustrated in FIGS. 3A-3C, the p-type substrate 51 can also include other devices or structures formed therein.

The second n-well 54b and the n-type isolation layer 59 can aid in electrically isolating the first and second p-wells 52a, 52b from the p-type substrate 51, thereby permitting the p-type substrate 51 and the first and second p-wells 52a, 52b to operate at different electrical potentials. As used herein, and as will be understood by one of skill in the art, the term "n-type isolation layer" refers to any suitable n-type isolation layer or structure, including, for example, those used in buried n-layer technologies or in deep n-well technologies. In the illustrated configuration, the second n-well 54b is configured to be electrically floating, which can aid in expanding a range of voltages over which the blocking voltage device's terminals can operate.

The third p-well 52c and the fourth P+ region 53d can form a guard ring or structure of the blocking voltage device 100. The guard ring can be employed to eliminate the formation of unintended parasitic paths between the blocking voltage device 100 and surrounding semiconductor components when integrated on-chip. In the illustrated configuration, the third p-well 52c is spaced from the second n-well 54b to enhance latch-up immunity by reducing the injection of carriers into the p-type substrate 51. The guard ring can be electrically connected to a substrate voltage $V_{SUB}$, which can be, for example, a power low or ground supply.

The illustrated blocking voltage device 100 includes the oxide regions 58. Formation of the oxide regions 58 can involve etching trenches in the p-type substrate 51, filling the trenches with a dielectric, such as silicon dioxide ($SiO_2$), and removing the excess dielectric using any suitable method, such as chemical-mechanical planarization. In certain implementations, the oxide regions 58 can be shallow trench (STI) regions or local oxidation of silicon (LOCOS) regions disposed between active regions.

In one embodiment, the first to third p-wells 52a-52c and the first and second n-wells 54a, 54b can have a depth similar to one another, such as a depth between about 3 μm and about 5.5 μm relative to a surface of the p-type substrate 51. In some implementations, the first to fifth P+ regions 53a-53e and the first to eighth N+ regions 55a-55h have a depth that is about 10 times to about 25 times less than a depth of the well within which the active region is formed. In certain implementations, the first to sixth shallow p-type regions 56a-56f have a depth that is about 3.5 times to about 5 times less than a depth of the first to third p-wells 52a-52c, and the first to third shallow n-type regions 57a-57c have a depth that is about 2.8 times to about 4.0 times less than a depth of the first and second n-wells 54a, 54b. The oxide regions 58 can have any suitable depth, such as depth that is about 6 times to about 12 times less than the depth of the first to third p-wells 52a-52c and the first and second n-wells 54a, 54b. In certain implementations, the oxide regions 58 can be relatively deeper than the first to fifth P+ regions 53a-53e and the first to eighth N+ regions 55a-55h.

The first to third p-wells 52a-52c and the first and second n-wells 54a, 54b used to construct the blocking voltage device 100 can be lightly doped and operate as blocking junctions and/or provide effective resistances that can aid in achieving a target built-in protection characteristic. In certain implementations, the n-wells can have peak doping concentrations in the range of about $10^{16}$ donors/cm$^3$ to about $10^{18}$ donors/cm$^3$, for instance, about $7 \times 10^{17}$ donors/cm$^3$. Additionally, in certain implementations the p-wells can have a peak doping concentration in the range of about $10^{16}$ donors/cm$^3$ to about $10^{18}$ donors/cm$^3$, for instance, about $9 \times 10^{17}$ donors/cm$^3$. However, persons having ordinary skill in the art will readily ascertain different doping levels.

The blocking voltage device 100 can undergo back end processing to form contacts and metallization. For clarity, these details are omitted in favor of using annotated electrical connections.

As shown in FIGS. 3B and 3C, the blocking voltage device 100 includes a ground terminal G, a cathode terminal C, and an anode terminal A. The ground terminal G is electrically connected to the third P+ region 53c and to the fourth and fifth N+ regions 55d, 55e. Additionally, the cathode terminal C is electrically connected to the second and fifth P+ regions 53b, 53e, to the second and third N+ regions 55b, 55c, and to the seventh and eighth N+ regions 55g, 55h. Furthermore, the anode terminal A is electrically connected to the first P+ region 53a and to the first and sixth N+ regions 55a, 55f.

In certain implementations, the ground terminal G is electrically connected to the substrate voltage $V_{SUB}$ using a power low decoupling circuit including one or more clamping structures, such as anti-parallel diodes. Including a power low decoupling circuit between the ground terminal G and the substrate voltage $V_{SUB}$ used to bias the substrate can help prevent latch-up by reducing carrier injection into the substrate during an overvoltage condition. However, other configurations are possible, including implementations in which the ground terminal G is directly connected to the substrate voltage $V_{SUB}$, implementations in which the ground terminal G is Kelvin connected to the substrate voltage $V_{SUB}$, or implementations in which the ground terminal G is connected to a dedicated ground or power low pad that is connected to the substrate voltage $V_{SUB}$ external to the IC.

Persons having ordinary skill in the art will appreciate that the blocking voltage device 100 of FIGS. 3A-3C can correspond to one implementation of the blocking voltage circuit 30 shown in FIG. 2. For example, the blocking voltage device 100 of FIG. 3C has been annotated to include the circuit devices shown in FIG. 2, such as the blocking diode 31, the first PNP bipolar transistor 32, the second or bidirectional PNP bipolar transistor 33, the first NPN bipolar transistor 34, the second NPN bipolar transistor 35, and the first to third resistors 41-43. The blocking voltage device 100 of FIG. 3C also is annotated to include circuit devices not shown in FIG. 2, such as a fourth resistor 81, a third PNP bipolar transistor 82, and a substrate PNP bipolar transistor 83.

The blocking diode 31 can have an anode formed from the first p-well 52a and a cathode formed from the first n-well 54a. Additionally, the first PNP bipolar transistor 32 can be a lateral parasitic bipolar device having an emitter formed from the second P+ region 53b, a base formed from the first n-well 54a, and a collector formed from the first p-well 52a. Furthermore, the bidirectional PNP bipolar transistor 33 can be a lateral parasitic bipolar device having an emitter/collector E/C formed from the second p-well 52b, a base formed from the n-type isolation layer 59, and a collector/emitter C/E formed from the first p-well 52a. Additionally, the third PNP bipolar transistor 82 can be a lateral parasitic bipolar device having an emitter formed from the second P+ region 53b, a base formed from the first n-well 54a, and a collector formed from the second p-well 52b. Furthermore, the first NPN bipolar transistor 34 can be a vertical parasitic bipolar device having an emitter formed from the first and sixth N+ regions 55a, 55f, a base formed from the first p-well 52a, and a collector formed from the n-type isolation layer 59. Additionally, the second NPN bipolar transistor 35 can be a vertical parasitic bipolar device having an emitter formed from the fourth and fifth N+ regions 55d, 55e, a base formed from the second p-well 52b, and a collector formed from the n-type isolation layer 59.

The first resistor 41 can be formed from a resistance of the first p-well 52a between the first P+ region 53a and the base of the first NPN bipolar transistor 34. Additionally, the second resistor 42 can be formed from a resistance of the first n-well 54a between the second N+ region 55b and the base of the first PNP bipolar transistor 32. Furthermore, the third resistor 43 can be formed from a resistance of the second p-well 52b between the third P+ region 53c and the base of the second NPN bipolar transistor 35. Additionally, the fourth resistor 81 can be formed from a resistance of the first n-well 54a between the third N+ region 55c and the base of the third PNP bipolar transistor 82.

During normal operating conditions between the anode terminal A and the cathode terminal C, the blocking voltage device 100 can operate similar to a high blocking voltage diode. For example, the blocking diode 31 associated with the first p-well 52a and the first n-well 54a can become forward biased when a voltage of the anode terminal A is greater than a voltage of the cathode terminal C, and can become reverse biased when the voltage of the anode terminal A is less than the voltage of the cathode terminal C. However, the illustrated blocking voltage device 100 also includes an integrated protection structure that can be used to protect the circuit from damage during overstress conditions.

For example, the blocking voltage device 100 includes a PNPN silicon controlled rectifier (SCR) including the first PNP bipolar transistor 32 and the first NPN bipolar transistor 34. The first PNP bipolar transistor 32 and the first NPN bipolar transistor 34 operate as a cross-coupled bipolar transistor pair that can protect the blocking diode 31 from damage from reverse breakdown during ESD and/or EMI events received between the anode terminal A and the cathode terminal C. In the illustrated configuration, the PNPN SCR is associated with the second P+ region 53b, the first n-well 54a, the first p-well 52a, and the first and sixth N+ regions 55a, 55f.

Additionally, the blocking voltage device 100 includes an NPNPN bidirectional SCR including the bidirectional PNP bipolar transistor 33 and the first and second NPN bipolar transistors 34, 35. In the illustrated configuration, the NPNPN bidirectional SCR is associated with the first and sixth N+ regions 55a, 55f, the first p-well 52a, the n-type isolation layer 59, the second p-well 52b, and the fourth and fifth N+ regions 55d, 55e.

The NPNPN bidirectional SCR can aid in preventing parasitic devices to the p-type substrate 51 from activating and becoming damaged when the blocking voltage device's anode terminal A is stressed relative to the ground terminal G. For example, the substrate PNP bipolar transistor 83 can include an emitter formed from the first p-well 52a, a base formed from the n-type isolation layer 59, and a collector formed from the p-type substrate 51. The NPNPN bidirectional SCR can be configured to turn-on during a transient electrical event before the substrate PNP bipolar transistor 83 activates, thereby preventing the substrate PNP bipolar transistor 83 from becoming damaged. For example, the first NPN bipolar transistor 34 and the bidirectional PNP bipolar transistor 33 operate as a first cross-coupled bipolar transistor pair that can protect the blocking voltage device 100 from an ESD and/or EMI event that causes the voltage of the ground terminal G to increase relative to the voltage of the anode terminal A. Additionally, the second NPN bipolar transistor 35 and the bidirectional PNP bipolar transistor 33 operate as a second cross-coupled bipolar transistor pair that can protect the blocking voltage device 100 from an ESD and/or EMI event that causes the voltage of the anode terminal A to increase relative to the voltage of the ground terminal G.

The illustrated blocking voltage device 100 further includes a PNPN SCR including the third PNP bipolar transistor 82 and the second NPN bipolar transistor 35. The third PNP bipolar transistor 82 and the second NPN bipolar transistor 35 operate as a cross-coupled bipolar transistor pair that can protect the blocking voltage device 100 from damage during ESD and/or EMI events received between the cathode terminal C and the ground terminal G, such as damage associated with a junction between the n-type isolation layer 59 and the p-type substrate 51. Although such a junction can be less sensitive to damage when the blocking voltage device 100 is used a blocking diode component, the third PNP bipolar transistor 82 and the second NPN bipolar transistor 35 can nevertheless aid in protection this junction.

The first to sixth shallow p-type regions 56a-56f can be included to enhance the protection characteristics of the blocking voltage device 100. For example, the first to sixth shallow p-type regions 56a-56f can have a higher doping concentration than the first and second p-wells 52a, 52b, and thus can be used to increase a concentration of holes near the N+ and P+ regions formed therein. Increasing the concentration of holes in these regions can enhance the overall current handling capability of the blocking voltage device 100, reduce the bipolar current gain of the first and second NPN bipolar transistors 34, 35, and increase the blocking voltage device's holding voltage to avoid latchup during ESD and/or EMI conditions. In certain implementations, the first, third, fourth and sixth shallow p-type regions 56a, 56c, 56d, 56f are used to control the gain of the first and second NPN bipolar transistors 34, 35, and the second and fifth shallow p-type regions 56b, 56e are used to reduce the resistance of the second and first p-wells 52b, 52a, respectively. Although the blocking voltage device 100 is illustrated as including the shallow p-type regions, in certain implementation the shallow p-type regions can be omitted or arranged in other ways. For example, in one embodiment, the second and fifth shallow p-type regions 56b, 56e are omitted. In another embodiment, the first to third shallow p-type regions 56a-56c are merged to operate as a first shallow p-type structure, and the fourth to sixth shallow p-type regions 56d-56f are merged to operate as a second shallow p-type structure.

The first to third shallow n-type regions 57a-57c can have a higher doping concentration relative to the n-wells in which they are formed, and thus can be used to reduce the resistance of the n-wells in which they are formed. For example, the third shallow n-type region 57c can reduce the device's sidewall n-well resistance. The first and second shallow n-type regions 57a, 57b can be used to enhance the conductivity and reduce the resistance of transistor and diode structures associated with the n-wells by increasing carrier concentration and the amount of current flowing near the device's surface. For example, the first and second shallow n-type regions 57a, 57b can be used to reduce an on-state resistance of the PNPN SCR structure including the first PNP bipolar transistor 32 and the first NPN bipolar transistor 34 as well as tuning the blocking voltage between the first n-well 54a and the first and second p-wells 52a, 52b. For example, positioning a shallow n-type region closer to a blocking junction can result in a lower blocking voltage. Although the blocking voltage device 100 is illustrated as including shallow n-type regions, in certain implementation the shallow n-type regions can be omitted or arranged in other ways.

In one embodiment, the first to sixth shallow p-type regions 56a-56f are shallower, narrower, and have a higher doping concentration than the first to third shallow n-type regions 57a-57c. However, other configurations are possible, such as configurations associated with a particular process used to fabricate the blocking voltage device 100. For example, in other implementations the first to sixth shallow p-type regions 56a-56f can have a depth that is about equal to a depth of the first to third shallow n-type regions 57a-57b. Accordingly, in some implementations the shallow p-type regions 56a-56f need not be shallower, narrower, and/or have a higher doping concentration that the shallow n-type regions 57a-57b.

The blocking voltage device 100 is annotated to show various dimensions of the wells, regions, and layers described above. In FIGS. 3A-3C, the blocking voltage device 100 is symmetrical. Accordingly, although dimensions are described below with respect to the left half of the device, the right half of the device can be configured to have similar dimensions. Persons having ordinary skill in the art will appreciate that the teachings herein are also applicable to asymmetric devices. For example, asymmetrical structures can be provided by arranging the wells, active regions, and/or other structures of the device in an asymmetric configuration.

A first distance $D_1$ shown in FIG. 3A is used to denote a width of the first p-well 52a, and can be used to control a width of the device's anode region. In certain implementations, the first distance $D_1$ can be selected to be in the range of about 25 µm to about 35 µm, for example, about 28 µm. However, other dimensions will be readily determined by one of skill in the art.

A second distance $D_2$ shown in FIG. 3A is used to denote a distance between an edge of the first N+ region 55a and an edge of the second N+ region 55b, and can be selected to control a conduction strength of the first PNP bipolar transistor 32 as well as to control the conduction characteristics of the blocking diode 31. In certain implementations, the second distance $D_2$ can be selected to be in the range of about 15 µm to about 25 µm, for example, about 20 µm. However, other dimensions will be readily determined by one of skill in the art.

A third distance $D_3$ shown in FIG. 3A is used to denote a distance between the first p-well 52a and the second p-well 52b, and can be selected to control a width of the device's cathode region. In certain implementations, the third distance $D_3$ can be selected to be in the range of about 30 µm to about 60 µm, for example, about 45 µm. However, other dimensions will be readily determined by one of skill in the art.

A fourth distance $D_4$ shown in FIG. 3A is used to denote a height of the N+ and P+ regions formed in the first p-well 52a and the first n-well 54a. Additionally, a fifth distance $D_5$ shown in FIG. 3A is used to denote a width of the N+ regions formed in the first p-well 52a and the first n-well 54a, and a sixth distance $D_6$ shown in FIG. 3A is used to denote a width of the P+ regions formed in the first p-well 52a and the first n-well 54a. The fourth to sixth distances $D_4$-$D_6$ can be selected to control, for example, the current handling capability of the blocking diode associated with the device and to optimize the trigger and holding voltages of the PNPN SCR between the anode and cathode terminals. In certain implementations, the fourth distance $D_4$ can be selected to be in the range of about 120 µm to about 180 µm, for example, about 150 µm, the fifth distance $D_5$ can be selected to be in the range of about 4.0 µm to about 7.0 µm, for example, about 4.8 µm, and the sixth distance $D_6$ can be selected to be in the range of about 4.0 µm to about 7.0 µm, for example, about 4.8 µm. However, other dimensions will be readily determined by one of skill in the art. Additionally, in certain implementations, the heights and widths of the N+ and P+ regions of the first p-well 52a and the first n-well 54a can be selected to have different values for each particular N+ and P+ region.

A seventh distance $D_7$ shown in FIG. 3A is used to denote a height of the first n-well 54a. In the illustrated configuration, current conduction between the anode terminal A and the cathode terminal C is configured to operate laterally. The seventh distance $D_7$ can be selected to be sufficiently large so as to prevent edge effects associated with vertical current flow. In certain implementations, the seventh distance $D_7$ can be selected to be in the range of about 260 µm to about 300 µm, for example, about 280 µm. However, other dimensions will be readily determined by one of skill in the art.

An eighth distance $D_8$ shown in FIG. 3B is used to denote a distance between an edge of the second shallow n-type region 57b and an edge of the second p-well 52b, and can aid in controlling the operational characteristics between the cathode terminal C and the ground terminal G. In certain implementations, the eighth distance $D_8$ can be selected to be in the range of about 0.3 µm to about 1.5 µm, for example, about 1 µm. However, other dimensions will be readily determined by one of skill in the art A ninth distance $D_9$ shown in FIG. 3B is used to denote a distance between an edge of the first shallow n-type region 57a and an edge of the first p-well 52a, and can be aid in controlling the operational characteristics of the blocking diode 31, such as the diode's blocking voltage. In certain implementations, the ninth distance $D_9$ can be selected to be in the range of about 0.3 µm to about 1.5 µm, for example, about 1 µm. However, other dimensions will be readily determined by one of skill in the art.

Although FIGS. 3A-3C illustrates one specific configuration of a blocking voltage device, other implementations are possible, such as multiple anode/cathode finger implementations, annular and circular layout array implementations, or other implementations adapted to chip-level layout, bonding and packaging constraints. For example, in certain implementations multiple anode regions can be formed as islands in the cathode region associated with the first n-well 54a. Furthermore, blocking voltage devices can be implemented in a variety of ways, such as those described and discussed below with reference to FIGS. 4A-5B.

FIGS. 4A-4H are cross sections of various embodiments of junction-isolated blocking voltage devices. The blocking voltage devices can be used to provide fine-tuned control of forward and reverse protection characteristics between the anode terminal A and the cathode terminal C and between the cathode terminal C and the ground terminal G.

Figure 4A:
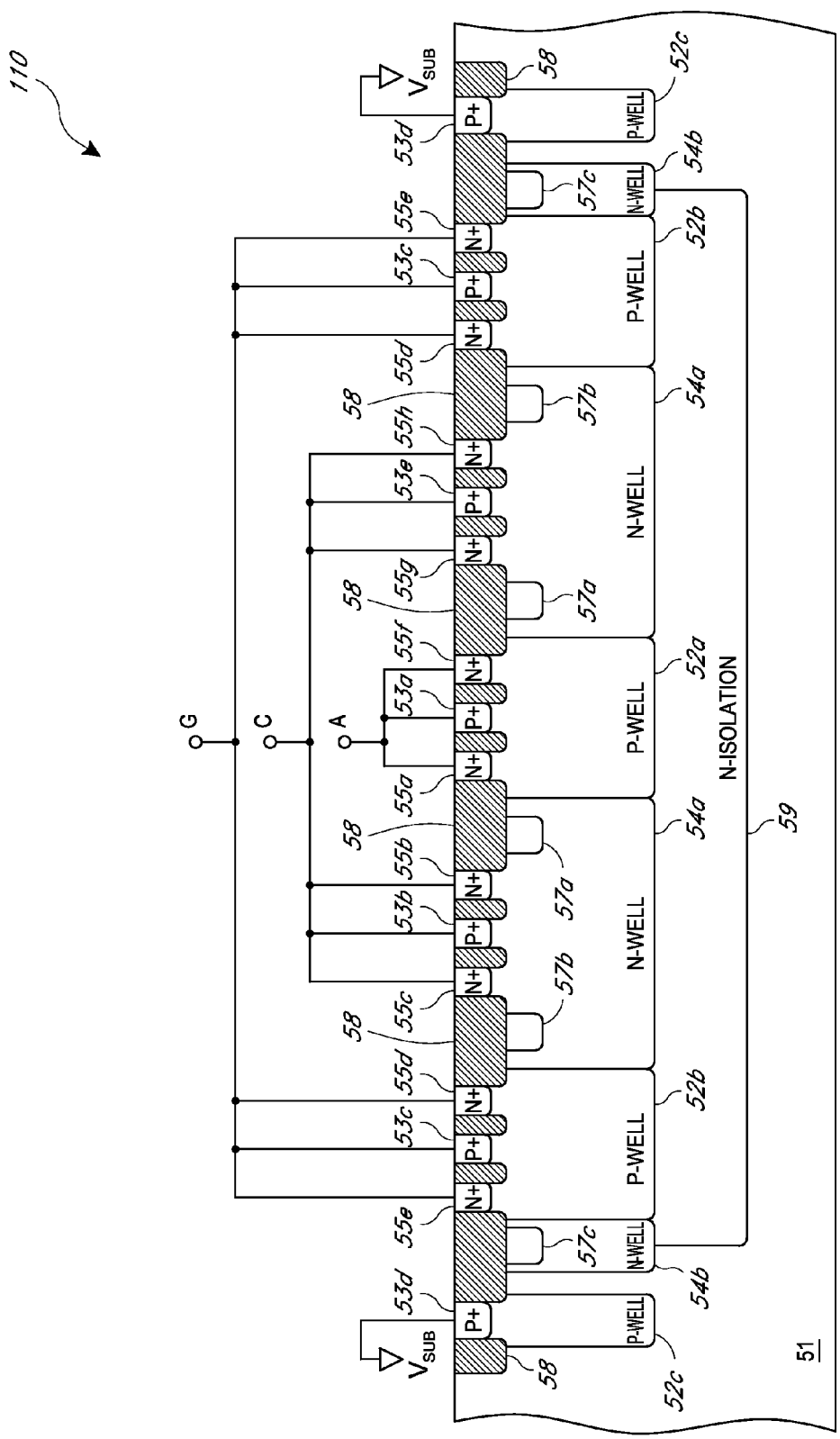
FIGS. 4A-4H are cross sections of various embodiments of junction-isolated blocking voltage devices.

FIG. 4A is a cross section of a junction-isolated blocking voltage device 110 according to one embodiment. The blocking voltage device 110 of FIG. 4A is similar to the blocking voltage device 100 of FIG. 3B, except that the blocking voltage device 110 of FIG. 4A does not include the first to sixth shallow p-type regions 56a-56f. In certain implementations, the first to sixth shallow p-type regions 56a-56f can be omitted, such as in configurations associated with sufficiently high p-well doping concentration near the surface, configurations including a separate deep p-well, or configurations in which shallow p-type regions are not available in a particular fabrication process.

Figure 4B:
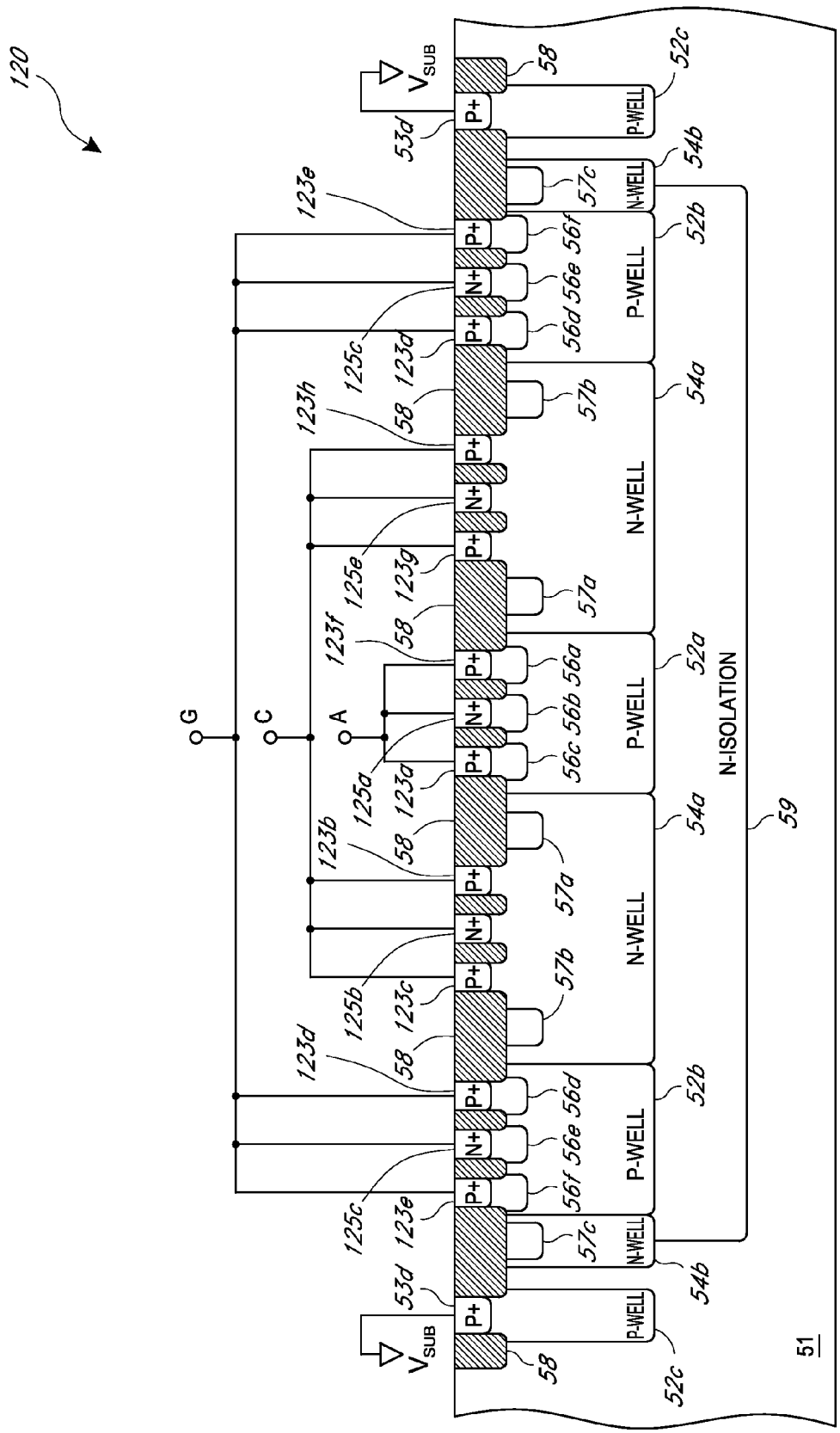

FIG. 4B is a cross section of a junction-isolated blocking voltage device 120 according to another embodiment. The blocking voltage device 120 of FIG. 4B is similar to the blocking voltage device 100 of FIG. 3B, except that the blocking voltage device 120 of FIG. 4B illustrates a configuration in which the polarity of the P+ and N+ regions formed in the first n-well 54a and the first and second p-wells 52a, 52b has been reversed. In particular, the blocking voltage device 120 of FIG. 4B is similar to the blocking voltage device 100 of FIG. 3B, except that the P+ regions 53a-53c, 53e have been replaced with N+ regions 125a-125c, 125e and the N+ regions 55a-55h have been replaced with P+ regions 123a-123h. With reference to FIGS. 2 and 4B, configuring the blocking voltage device 120 in this manner can increase the injection of holes and recombination of electrons in the device, thereby enhancing the operation of the first PNP bipolar transistor 32 and the bidirectional PNP bipolar transistor 33 relative to the first and second NPN bipolar transistors 34, 35. Additionally, the blocking voltage device 120 of FIG. 4B can also have a larger PNP emitter area relative to the blocking voltage device 100 of FIG. 3B, which can reduce the emitter resistance of the first PNP bipolar transistor 32 and the bidirectional PNP bipolar transistor 33. Increasing the strength of the device's PNP bipolar transistors relative to the strength of the device's NPN bipolar transistors can help increase the holding voltage of the PNPN SCR 46 and the forward and reverse holding voltages of the NPNPN bidirectional SCR 47 to levels suitable for use in a particular application.

Figure 4C:
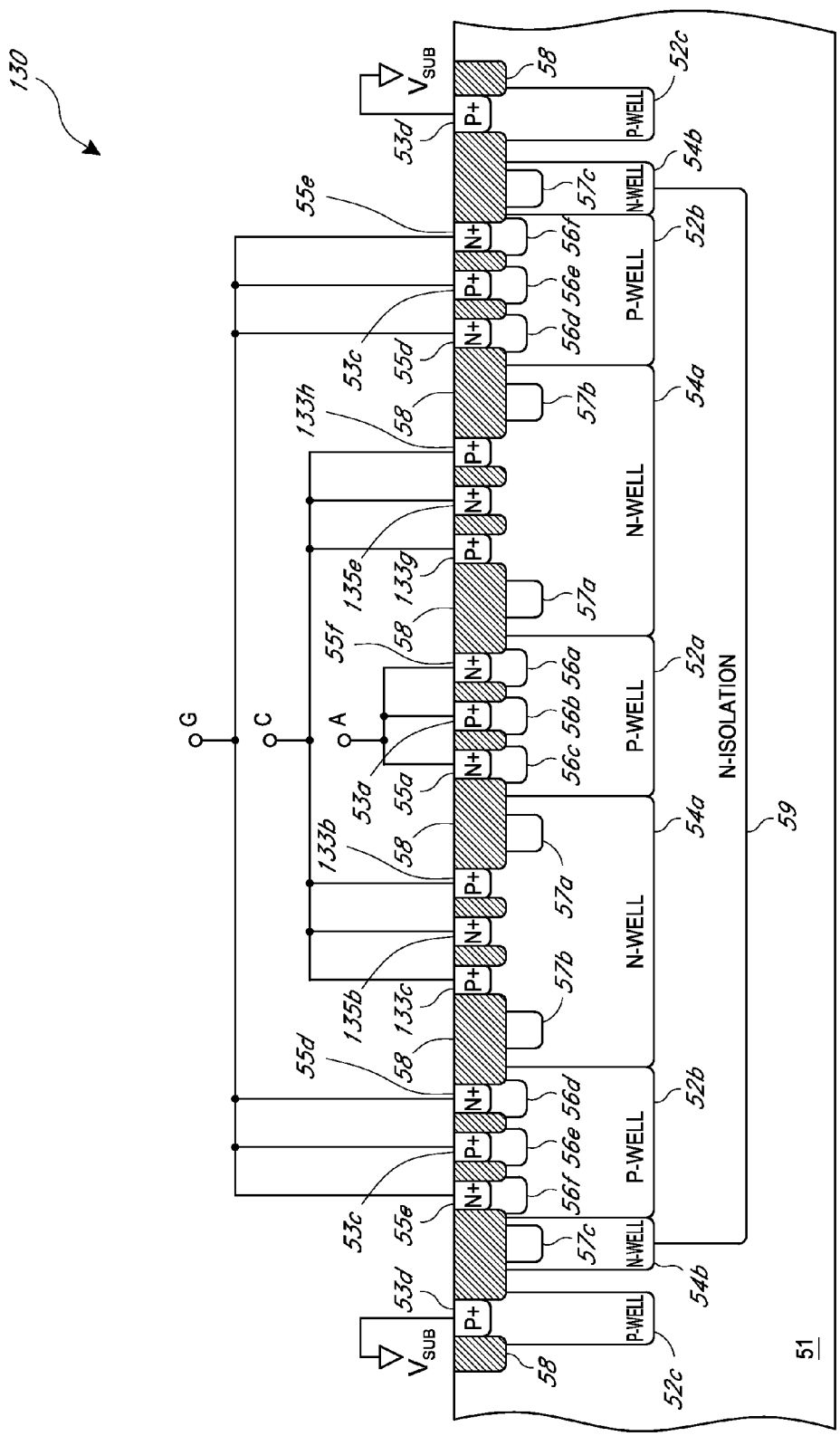

FIG. 4C is a cross section of a junction-isolated blocking voltage device 130 according to another embodiment. The blocking voltage device 130 of FIG. 4C is similar to the blocking voltage device 100 of FIG. 3B, except that the blocking voltage device 130 of FIG. 4C illustrates a configuration in which the polarity of the P+ and N+ regions formed in the first n-well 54a has been reversed. In particular, the blocking voltage device 130 of FIG. 4C is similar to the blocking voltage device 100 of FIG. 3B, except that the P+ regions 53b, 53e have been replaced with N+ regions 135b, 135e and the N+ regions 55b-55c, 55g, 55h have been replaced with P+ regions 133b-133c, 133g, 133h. With reference to FIGS. 2 and 4C, configuring the blocking voltage device 130 in this manner can increase the strength of the first PNP bipolar transistor 32 and the strength of the first NPN bipolar transistor 34, thereby decreasing the holding voltage of the PNPN SCR 46.

Figure 4D:
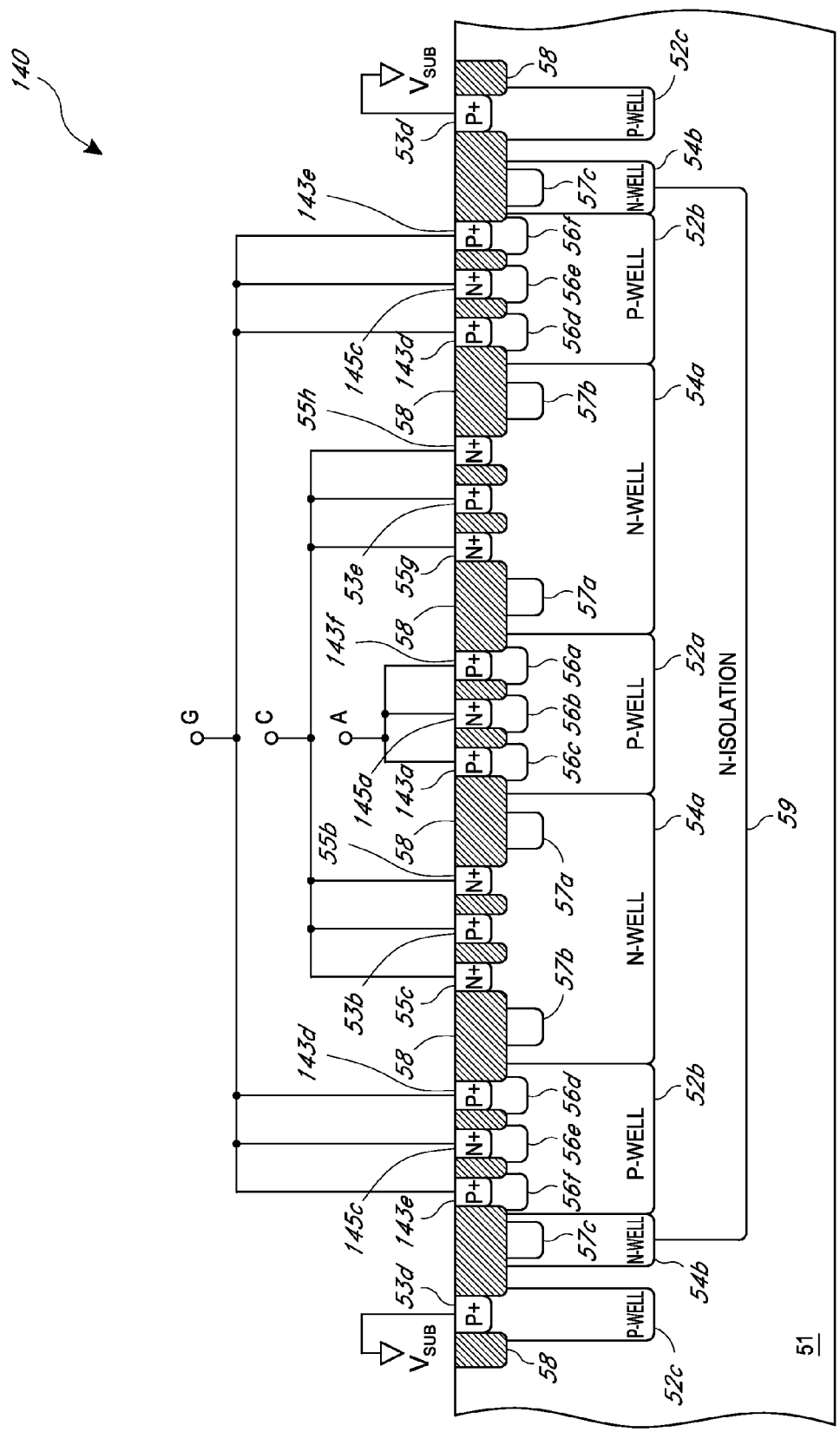

FIG. 4D is a cross section of a junction-isolated blocking voltage device 140 according to another embodiment. The blocking voltage device 140 of FIG. 4D is similar to the blocking voltage device 100 of FIG. 3B, except that the blocking voltage device 140 of FIG. 4D illustrates a configuration in which the polarity of the P+ and N+ regions formed in the first and second p-wells 52a, 52b has been reversed. In particular, the blocking voltage device 140 of FIG. 4D is similar to the blocking voltage device 100 of FIG. 3B, except that the P+ regions 53a, 53c have been replaced with N+ regions 145a, 145c and the N+ regions 55a, 55d-55f have been replaced with P+ regions 143a, 143d-143f. With reference to FIGS. 2 and 4A-4D, configuring the blocking voltage device 140 in this manner can decrease the strength of the bidirectional PNP bipolar transistor 33 and the strength of the first and second NPN bipolar transistors 34, 35 relative to configurations shown in FIGS. 4A-4D, thereby increasing the forward and reverse holding and trigger voltages of the NPNPN bidirectional SCR 47.

Figure 4E:
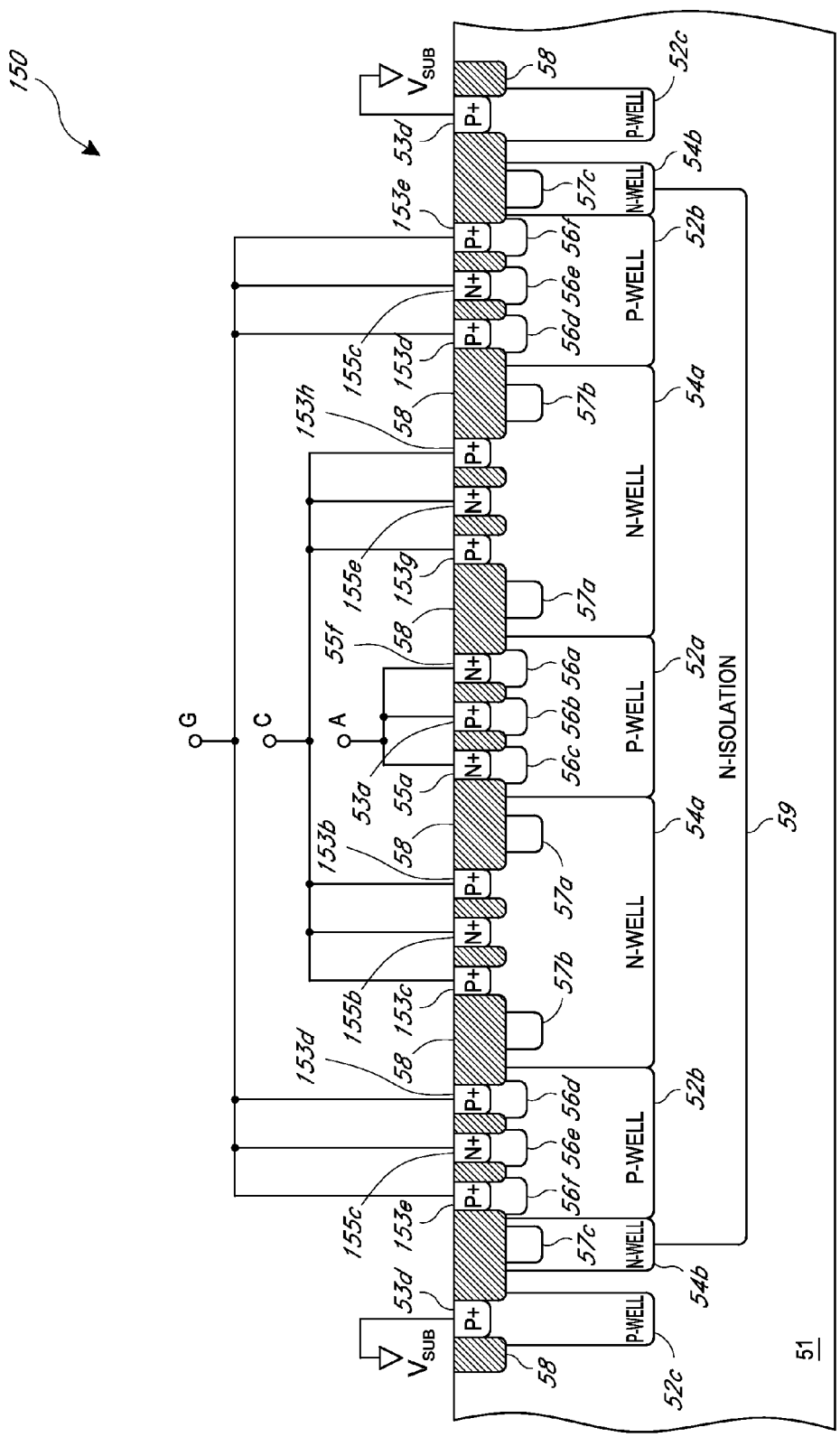

FIG. 4E is a cross section of a junction-isolated blocking voltage device 150 according to another embodiment. The blocking voltage device 150 of FIG. 4E is similar to the blocking voltage device 100 of FIG. 3B, except that the blocking voltage device 150 of FIG. 4E illustrates a configuration in which the polarity of the P+ and N+ regions formed in the first n-well 54a and the second p-well 52b has been reversed. In particular, the blocking voltage device 150 of FIG. 4E is similar to the blocking voltage device 100 of FIG. 3B, except that the P+ regions 53b-53c, 53e have been replaced with N+ regions 155b-155c, 155e and the N+ regions 55b-55e, 55g-55h have been replaced with P+ regions 153b-153e, 153g-153h. With reference to FIGS. 2 and 4E, configuring the blocking voltage device 150 in this manner can increase the strength of the first PNP bipolar transistor 32 relative to the strength of the first NPN bipolar transistor 34 and can increase the strength of the bidirectional PNP bipolar transistor 33 relative to the strength of the second NPN bipolar transistor 35, thereby increasing the holding voltage of the PNPN SCR 46 and increasing the forward holding voltage of the NPNPN bidirectional SCR 47.

Figure 4F:
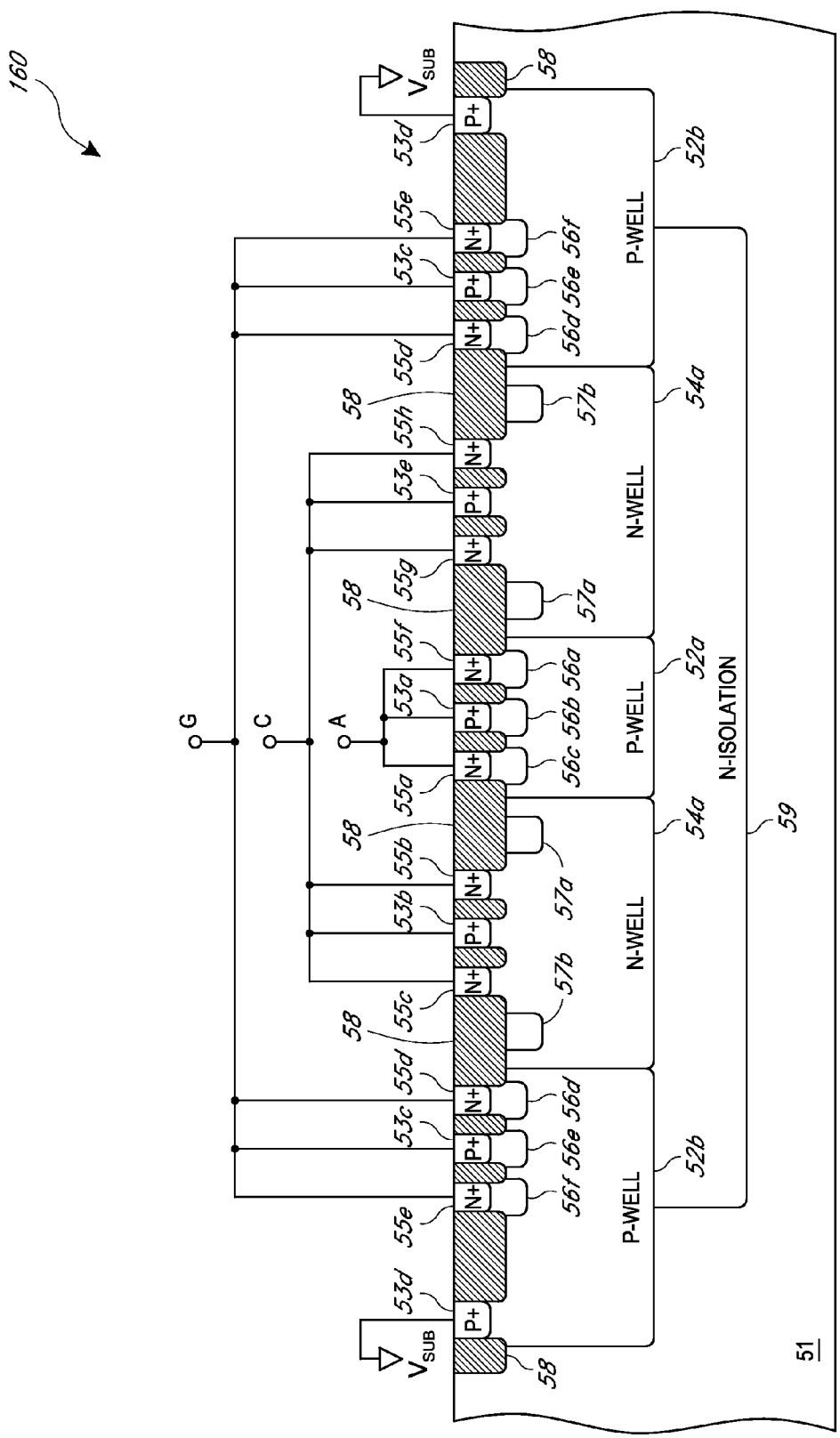

FIG. 4F is a cross section of a junction-isolated blocking voltage device 160 according to another embodiment. The blocking voltage device 160 of FIG. 4F is similar to the blocking voltage device 100 of FIG. 3B, except that the blocking voltage device 160 of FIG. 4F omits the second n-well 54b, the third shallow n-type region 57c, and the third p-well 52c. Additionally, the second p-well 52b has been extended such that the third and fourth P+ regions 53c, 53d and the fourth and fifth N+ regions 55d, 55e are formed in the second p-well 52b. Configuring the blocking voltage device 160 in this manner can slightly reduce the area of the blocking voltage device 160 of FIG. 4F relative to the configuration shown in FIGS. 3A-3C while providing similar protection characteristics. However, omitting the second n-well 54b can increase the likelihood of latch-up to other unrelated n-wells biased to different electrical potentials when the blocking voltage device 160 is integrated on-chip and shares the same semiconductor substrate with other circuitry.

Figure 4G:
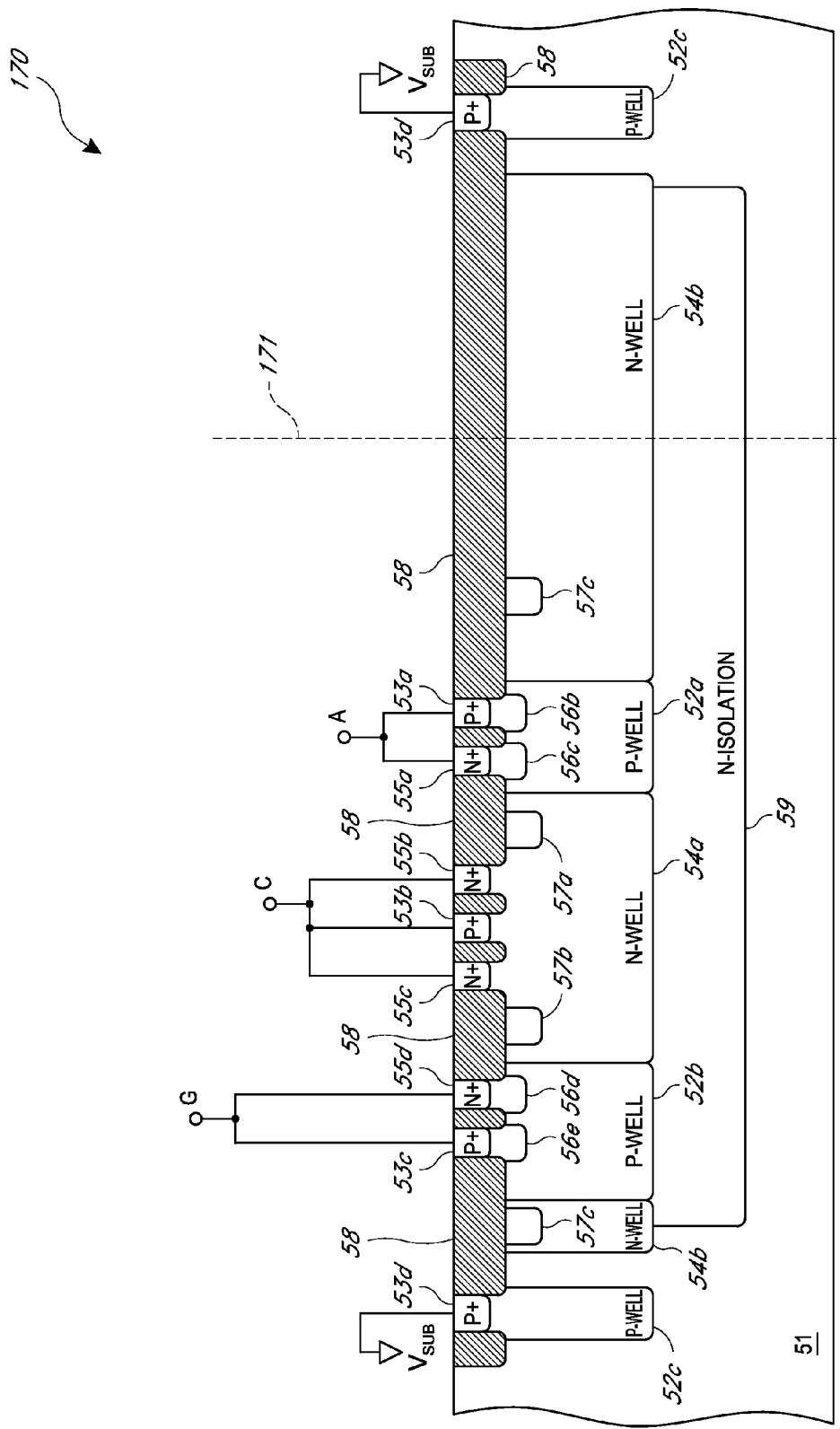

FIG. 4G is a cross section of a junction-isolated blocking voltage device 170 according to another embodiment. The blocking voltage device 170 of FIG. 4G illustrates one example of an asymmetric configuration of a blocking voltage device. For example, the blocking voltage device 170 or FIG. 4G is similar to the blocking voltage device 100 of FIG. 3B, except that the blocking voltage device 170 of FIG. 4G omits the fifth P+ region 53e, the fifth to eighth N+ regions 55e-55h, and the first and sixth shallow p-type regions 56a, 56f. Additionally, rather than configuring the first n-well 54a as a first ring surrounding the first p-well 52a and configuring the second p-well 52b as a second ring surrounding the first n-well 54a, the blocking voltage device 170 illustrates a different implementation. In particular, the first n-well 54a has been positioned between the first and second p-wells 52a, 52b, and the second n-well 54b has been configured as a first ring that surrounds the first n-well 54a and the first and second p-wells 52a, 52b. Furthermore, the third p-well 52c has been configured as a second ring that surrounds but does not abut the second n-well 54b. To help prevent the formation of parasitic structures between the first p-well 52a and the p-type substrate 51, a portion of the second n-well 54b adjacent the first p-well 52a has been configured to be wider than a portion of the second n-well 54b adjacent the second p-well 52b. Additional details of the blocking voltage device 170 of FIG. 4G can be similar to those described earlier.

The blocking voltage device 170 of FIG. 4G illustrates a configuration in which the device's anode terminal A, the cathode terminal C, and the ground terminal G are arranged side-by-side. However, other configurations of the blocking voltage device 170 are possible. For example, in certain implementations, the polarity of the device's P+ and N+ regions in the first n-well 54a and the first and second p-wells 52a, 52b can be reversed in a manner similar to that described earlier with respect to FIGS. 4B-4E. In other implementations, certain regions can be omitted, such as shallow n-type and/or shallow p-type regions. Furthermore, in one embodiment, the blocking voltage device 170 is configured so that a portion of the device to the left of the line 171 is mirrored and replicated to the right of the line 171. In such a configuration, the first p-well 52a, the first n-well 54a, the second p-well 52b, a left portion of the n-well 54b adjacent the second p-well 52b, and a left portion of the p-well 52c can be configured to surround a floating n-well in an annular configuration, such that a right portion of n-well 54b is defined as the center of the annular structure.

Figure 4H:
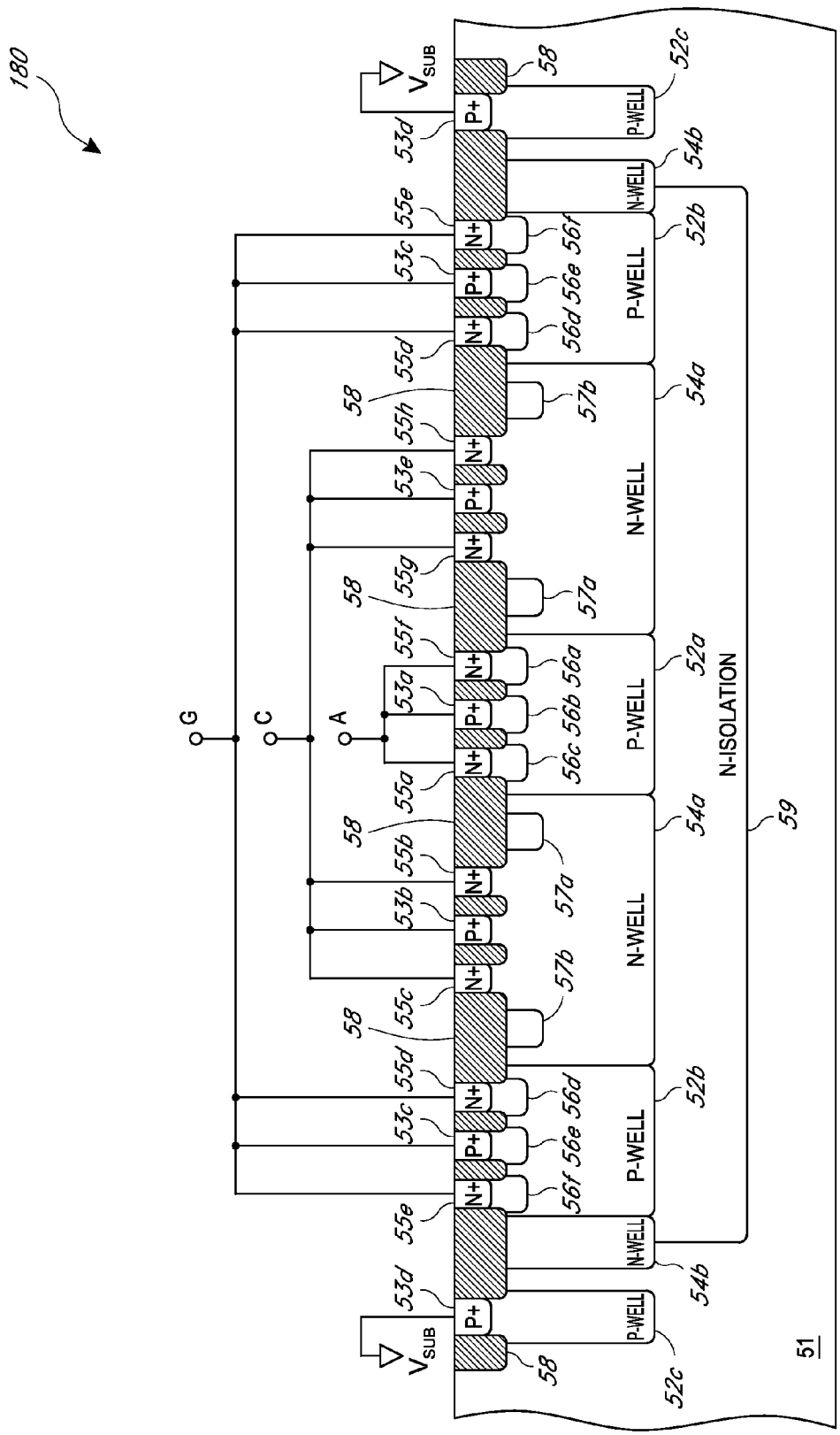

FIG. 4H is a cross section of a junction-isolated blocking voltage device 180 according to one embodiment. The blocking voltage device 180 of FIG. 4H is similar to the blocking voltage device 100 of FIG. 3B, except that the blocking voltage device 180 of FIG. 4H does not include the third shallow n-type region 57c. Although including the third shallow n-type region 57c can reduce the device's sidewall n-well resistance, in certain implementations the third shallow n-type region 57c can be omitted, such as in configurations in which additional doping is not used to reduce the parasitic bipolar gain.

Figure 5A:
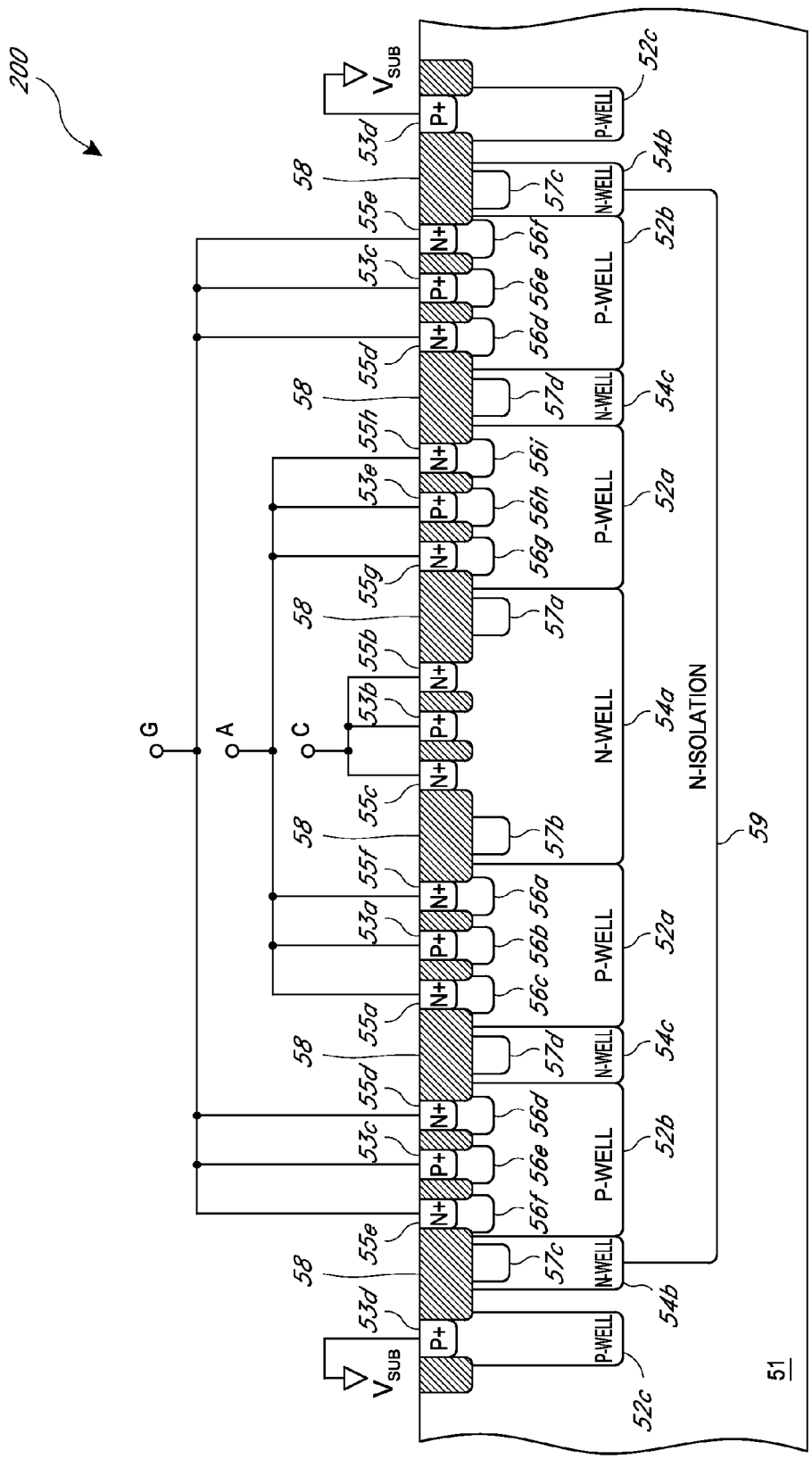
FIG. 5A is a cross section of a junction-isolated blocking voltage device with an integrated protection structure according to another embodiment.
Figure 5B:
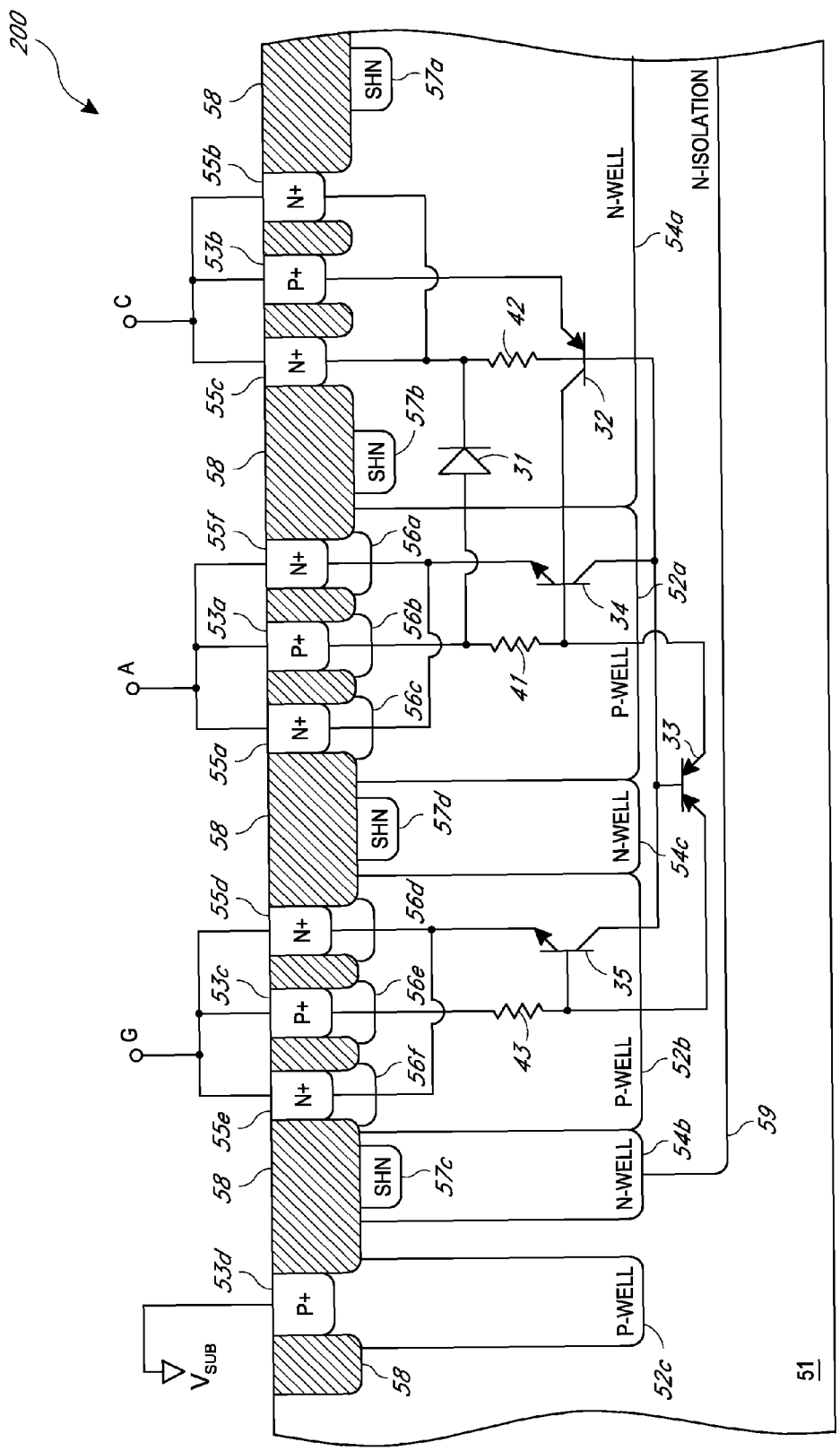
FIG. 5B is an annotated cross section of a portion of the junction-isolated blocking voltage device of FIG. 5A.

FIG. 5A is a cross section of a junction-isolated blocking voltage device 200 with an integrated protection structure according to another embodiment. FIG. 5B is an annotated cross section of a portion of the junction-isolated blocking voltage device 200 of FIG. 5A.

The blocking voltage device 200 is formed in the p-type substrate 51, and includes first to third p-wells 52a-52c, first to fifth P+ regions 53a-53e, first to third n-wells 54a-54c, first to eighth N+ regions 55a-55h, first to ninth shallow p-type regions 56a-56i, first to fourth shallow n-type regions 57a-57d, oxide regions 58, and the n-type isolation layer 59.

The blocking voltage device 200 of FIGS. 5A-5B illustrates a configuration in which the order of the anode terminal A and the cathode terminal C has been reversed relative to that of the blocking voltage device 100 of FIGS. 3A-3C. For example, the first p-well 52a is configured as a first ring that surrounds and abuts the first n-well 54a such that the first n-well 54a is an island in the first p-well 52a. Additionally, the third n-well 54c is configured as a second ring that surrounds and abuts the first p-well 52a, and can be used to provide electrical isolation between the cathode terminal C and the ground terminal G. Furthermore, the second p-well 52b is configured as a third ring that surrounds and abuts the third n-well 54c. Additionally, the second n-well 54b is configured as a fourth ring that surrounds and abuts the second p-well 52b. Furthermore, the third p-well 52c is configured as a fifth ring that surrounds but does not abut the second n-well 54b.

The first to fourth P+ regions 53a-53d, the first to sixth N+ regions 55a-55f, the first to sixth shallow p-type regions 56a-56f, and the first to third shallow n-type regions 57a-57c are formed in the first to third p-wells 52a-52c and the first and second n-wells 54a, 54b in a manner similar to that described earlier with respect to FIGS. 3A-3C. However, in contrast to the blocking voltage device 100 of FIGS. 3A-3B in which the fifth P+ region 53e and the seventh and eighth N+ regions 55g, 55h are formed in the first n-well 54a, in the illustrated configuration the fifth P+ region 53e and the seventh and eighth N+ regions 55g, 55h are formed in the first p-well 52a. Additionally, the seventh to ninth shallow p-type regions 56g-56i are formed beneath the seventh N+ region 55g, the fifth P+ region 53e, and the eighth N+ region 55h, respectively. Furthermore, the fourth shallow n-type region 57d is formed in the third n-well 54c. Additionally, the n-type isolation layer 59 is disposed beneath the first p-well 52a, the first n-well 54a, the second p-well 52b, the third n-well 54c, and beneath a portion of the second n-well 54b.

The blocking voltage device 200 of FIGS. 5A-5B can correspond to another implementation of the blocking voltage circuit 30 shown in FIG. 2. For example, FIG. 5B has been annotated to include the circuit devices shown in FIG. 2, such as the blocking diode 31, the first PNP bipolar transistor 32, the second or bidirectional PNP bipolar transistor 33, the first NPN bipolar transistor 34, the second NPN bipolar transistor 35, and the first to third resistors 41-43.

The blocking voltage device 200 of FIGS. 5A-5B illustrates a configuration in which the order of the anode terminal A and the cathode terminal C has been reversed relative to that of the blocking voltage device 100 of FIGS. 3A-3C. To aid in electrically isolating the anode terminal A from the ground terminal G, the third n-well 54c has been included between the first and second p-wells 52a, 52b. Including the third n-well 54c in the blocking voltage device 200 can increase the device's size relative to the blocking voltage device 100 shown in FIGS. 3A-3C. Additional details of the blocking voltage device 200 can be similar to those described earlier.

In the embodiments described above, the protections devices can include layers, regions, and/or wells having n-type or p-type dopants. In other embodiments, the doping types of all the layers, regions, and wells of the blocking voltage devices can be opposite to those described and shown in the above embodiments, and the same principles and advantages can still apply to the other embodiments. For example, a complementary version of the blocking voltage devices of FIGS. 3A-5B can be formed using an n-type substrate. In such embodiments, an n-type isolation layer is replaced with a p-type isolation layer, and the n-wells and p-wells of the blocking voltage device can be replaced with p-wells and n-wells, respectively. Additionally, the n-type active regions and the p-type active regions can be replaced with p-type active regions and n-type active regions, respectively.

Figure 6B:
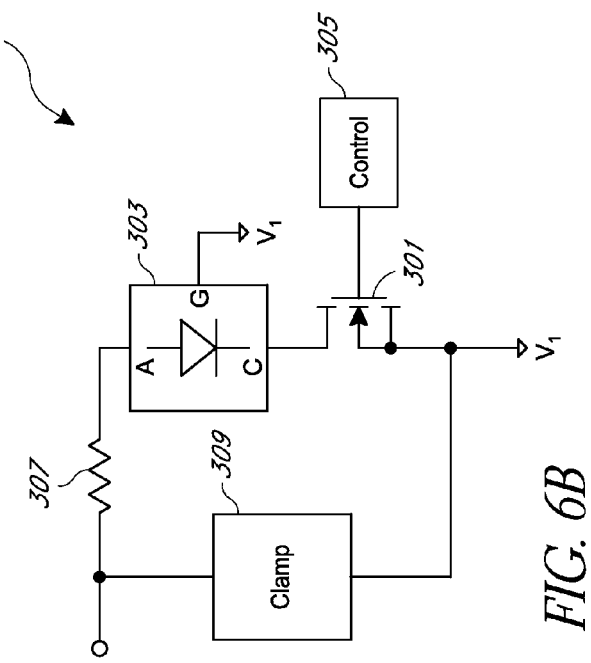
FIGS. 6A-6C are circuit diagrams of various embodiments of interface circuits for an IC.
Figure 6A:
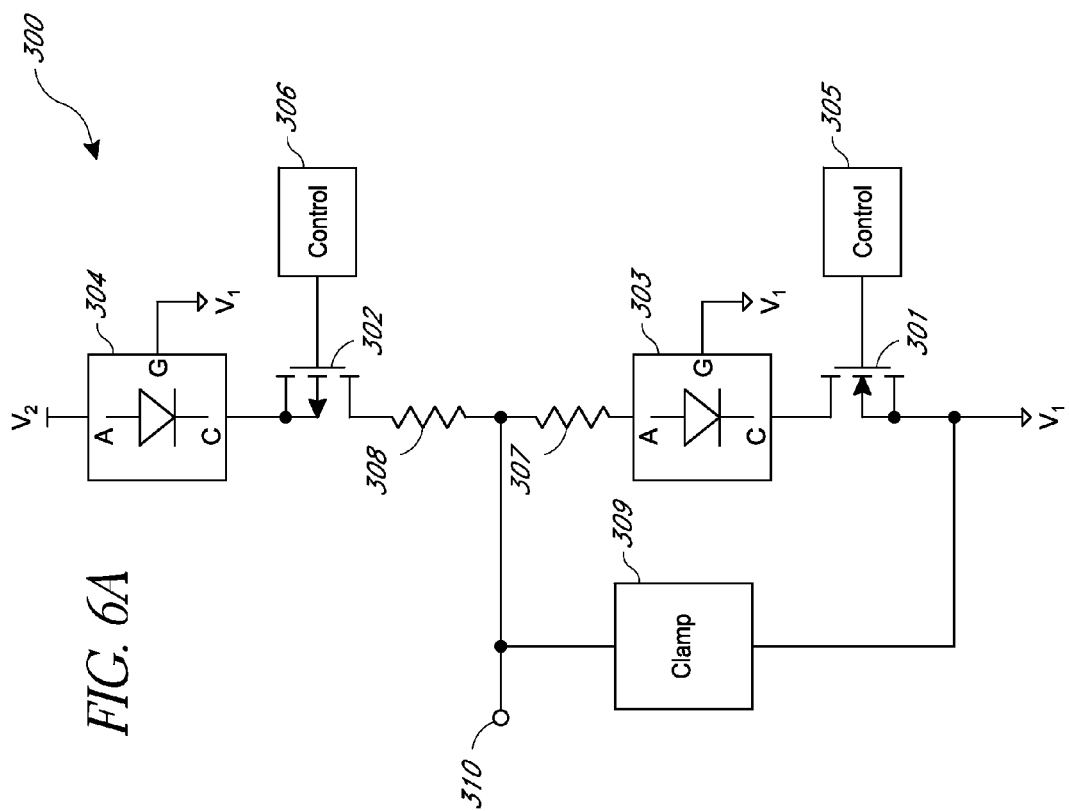
Figure 6C:
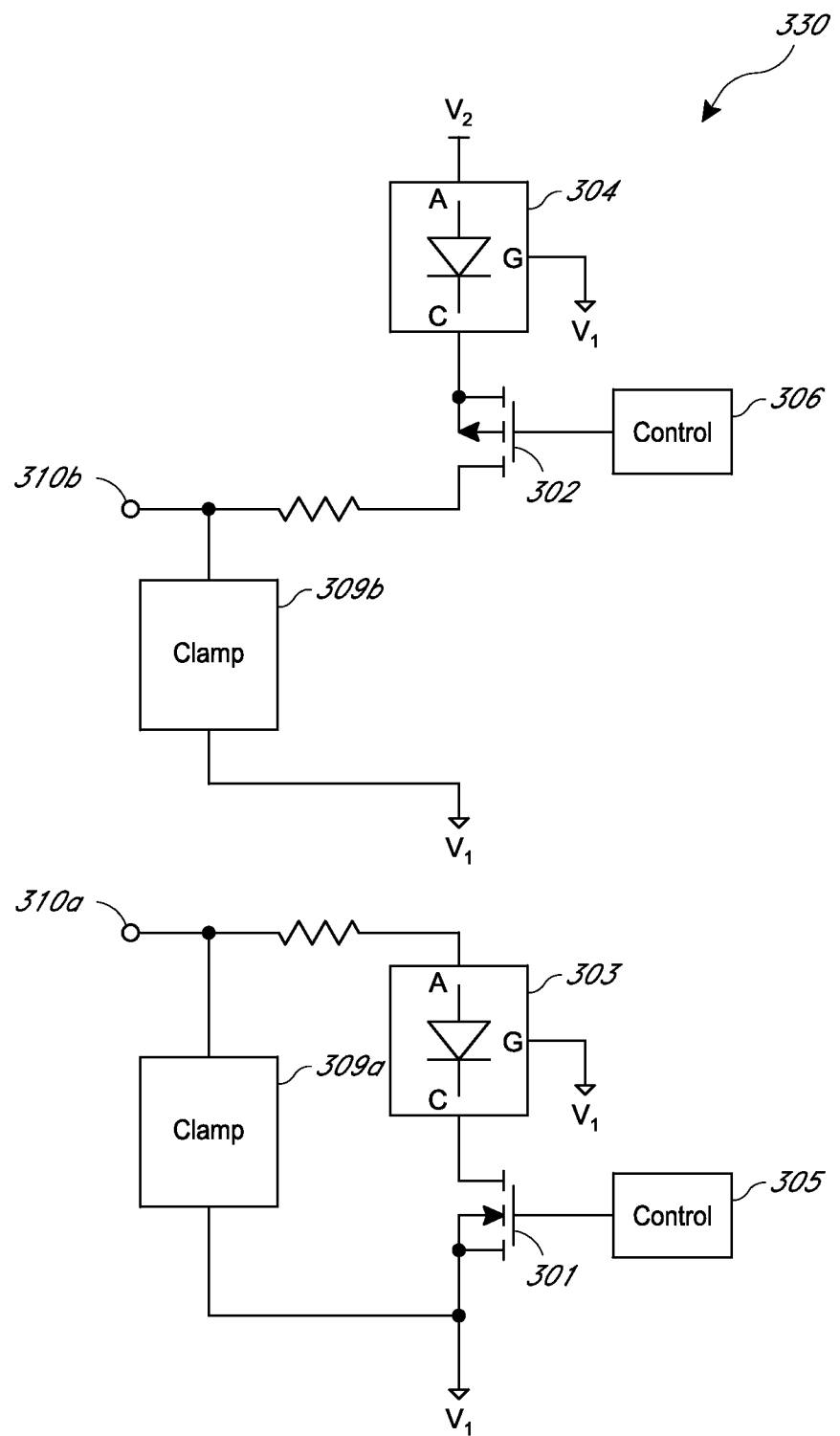

FIGS. 6A-6C are circuit diagrams of various embodiments of interface circuits for an IC. The interface circuits illustrate various configurations in which the blocking voltage devices described herein can be used. However, the blocking voltage devices can be used in other arrangements and implementations.

FIG. 6A is a circuit diagram of one example of an interface circuit 300 of an IC. The interface circuit 300 includes an n-type double-diffused metal oxide semiconductor (NDMOS) transistor 301, a p-type double-diffused metal oxide semiconductor (PDMOS) transistor 302, a first blocking voltage device 303, a second blocking voltage device 304, a first interface control circuit 305, a second interface control circuit 306, a first resistor 307, a second resistor 308, a protection device or clamp 309, and a pad 310. The interface circuit 300 can be used, for example, as a driver circuit for a FLEXRAY or high and low side LIN interface.

The NDMOS transistor 301 includes a source and body electrically connected to a first power supply $V_1$, which can be, for example, a ground or power low supply. The NDMOS transistor 301 further includes a gate electrically connected to an output of the first interface control circuit 305. The NDMOS transistor 301 further includes a drain electrically connected to a cathode terminal of the first blocking voltage device 303. The first blocking voltage device 303 further includes a ground terminal electrically connected to the first power supply $V_1$ and an anode terminal electrically connected to a first end of the first resistor 307. The first resistor 307 further includes a second end electrically connected to a first end of the second resistor 308, to a first terminal of the protection clamp 309, and to the pad 310. The protection clamp 309 further includes a second terminal electrically connected to the first power supply $V_1$. The second resistor 308 further includes a second end electrically connected to a drain of the PDMOS transistor 302. The PDMOS transistor 302 further includes a gate electrically connected to an output of the second interface control circuit 306 and a source and body electrically connected to a cathode terminal of the second blocking voltage device 304. The second blocking voltage device 304 further includes a ground terminal electrically connected to the first power supply $V_1$ and an anode terminal electrically connected to a second power supply $V_2$, which can be, for example, a power high supply.

The first and second interface control circuits 305, 306 can be used to control a voltage level of the pad 310. For example, the NDMOS and PDMOS transistors 301, 302 include gates electrically connected to outputs of the first and second interface control circuits 305, 306, respectively. In certain implementations, the gate of the NDMOS transistor 301 is controlled to a voltage level corresponding to a desired sink current and/or the gate of the PDMOS transistor 302 is controlled to a voltage level corresponding to a desired source current so as to control a voltage level of the pad 310.

The first and second blocking voltage devices 303, 304 can help extend the operational voltage range of the pad 310. For example, the signaling conditions on the pad 310 may include positive and negative voltage signaling levels, and the first and second blocking voltage devices 303, 304 can be used to prevent the bodies of the NDMOS and PDMOS transistors 301, 302 from becoming forward-biased when the voltage of the pad 310 falls below the voltage level of the first power supply $V_1$ or rises above the voltage level of the second power supply $V_2$.

The first and second resistors 307, 308 can help prevent current flowing through the NDMOS and PDMOS transistors 301, 302, respectively, during a transient electrical event received on the pad 310. In some implementations, the first resistor 307 has a resistance selected to be in the range of about 0Ω (omitted) and about 10Ω and the second resistor 308 has a resistance selected to be in the range of about 0Ω (omitted) and 10Ω However, persons having ordinary skill in the art will readily ascertain other suitable resistance values, such as resistance values associated with signal processing integrity and/or minimum noise constraints. Although the first and second resistors 307, 308 can help prevent current flowing through sensitive circuitry of the interface, the first and second resistors 307, 308 can also degrade signal quality. Accordingly, in certain implementations either or both of the first and second resistors 307, 308 can be omitted.

When a transient electrical event is received on the pad 310, the voltage of the pad 310 can increase until the trigger voltage of the protection clamp 309 is reached. However, in certain implementations, there can be an overshoot of voltage on the pad 310 before the protection clamp 309 activates. As described earlier, the first and second blocking voltage devices 303, 304 can include integrated protection structures that can prevent sensitive portions of interface circuitry from becoming damaged before the protection clamp 309 activates. Additional details of the first and second blocking voltage devices 303, 304 can be as described earlier.

FIG. 6B is a circuit diagram of another example of an interface circuit 320 of an IC. The interface circuit 320 includes the NDMOS transistor 301, the first blocking voltage device 303, the first interface control circuit 305, the first resistor 307, and the pad 310. The interface circuit 320 can be used, for example, as a driver circuit for a low side LIN interface. Additional details of the interface circuit 320 can be similar to those described earlier.

FIG. 6C is a circuit diagram of another example of an interface circuit 330 of an IC. The interface circuit 330 includes the NDMOS transistor 301, the PDMOS transistor 302, the first and second blocking voltage devices 303, 304, the first and second interface control circuits 305, 306, the first and second resistors 307, 308, first and second protection clamps 309a, 309b, and first and second pads 310a, 310b. The interface circuit 330 can be used, for example, as a driver circuit for a CAN interface.

The interface circuit 330 of FIG. 6C can be similar to the interface circuit 300 of FIG. 6A. However, in contrast to the interface circuit 300 of FIG. 6A in which the NDMOS and PDMOS transistors 301, 302 have been configured to drive the pad 310, the interface circuit 330 of FIG. 6C illustrates a differential configuration in which the NDMOS and PDMOS transistors 301, 302 have been configured to drive the first and second pads 310a, 310b, respectively. Additionally, separate protect clamps 309a, 309b have been connected between the first power supply $V_1$ and the first and second pads 310a, 310b, respectively. Additional details of the interface circuit 330 can be similar to those described earlier.

FIGS. 7A-7D show graphs of transmission line pulsing (TLP) laboratory data for one example of a junction-isolated blocking voltage device. The graphs correspond to data associated with one implementation of the blocking voltage device 100 of FIGS. 3A-3C.

Figure 7A:
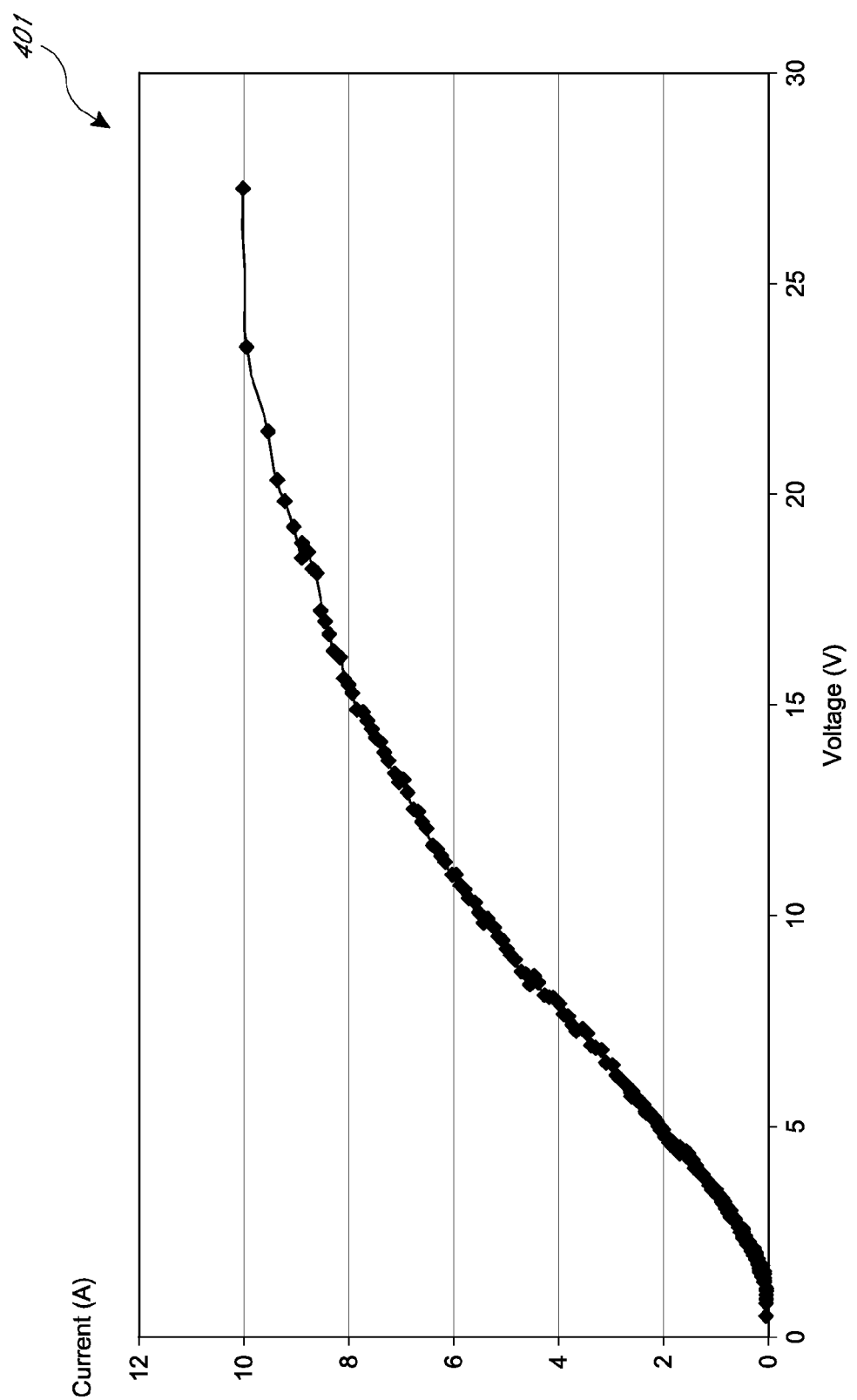
FIGS. 7A-7D show graphs of transmission line pulsing (TLP) laboratory data for one example of a junction-isolated blocking voltage device.
Figure 7B:
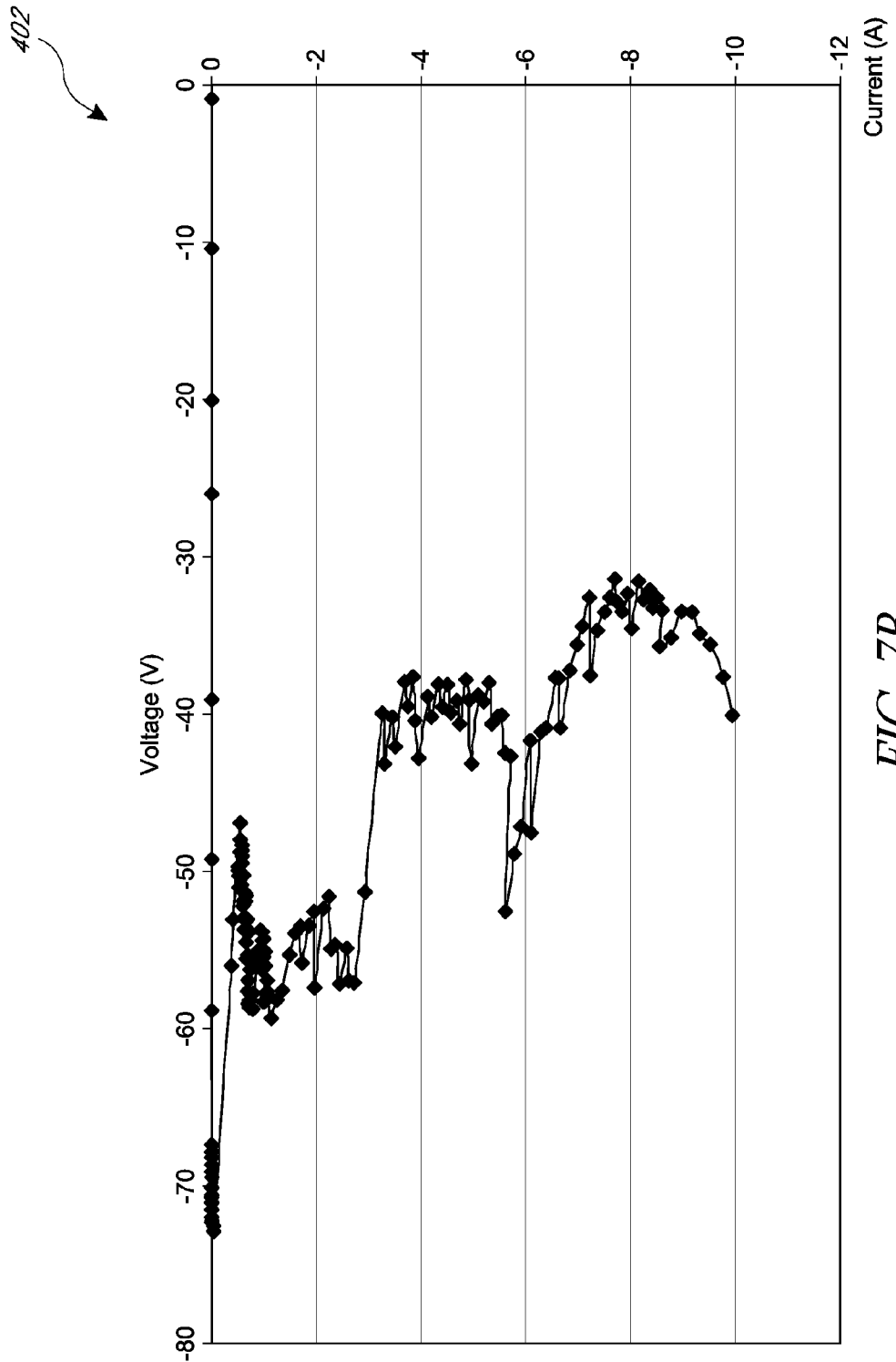

FIG. 7A is a graph 401 of TLP current-voltage characteristics of one embodiment of the blocking voltage device 100 of FIGS. 3A-3C, tested for forward bias between the anode terminal A and the cathode terminal C. As shown in the graph 401, the blocking voltage device can operate similar to a blocking diode under such bias conditions. FIG. 7B is a graph 402 of TLP current-voltage characteristics of one embodiment of the blocking voltage device 100 of FIGS. 3A-3C, tested for reverse bias between the cathode terminal C and the anode terminal A. As shown in FIG. 7B, the blocking voltage device can have a relatively high blocking voltage greater than about 70 V. Additionally, as the magnitude of the voltage further increases, the device's PNPN SCR can activate and provide protection to the device.

Figure 7C:
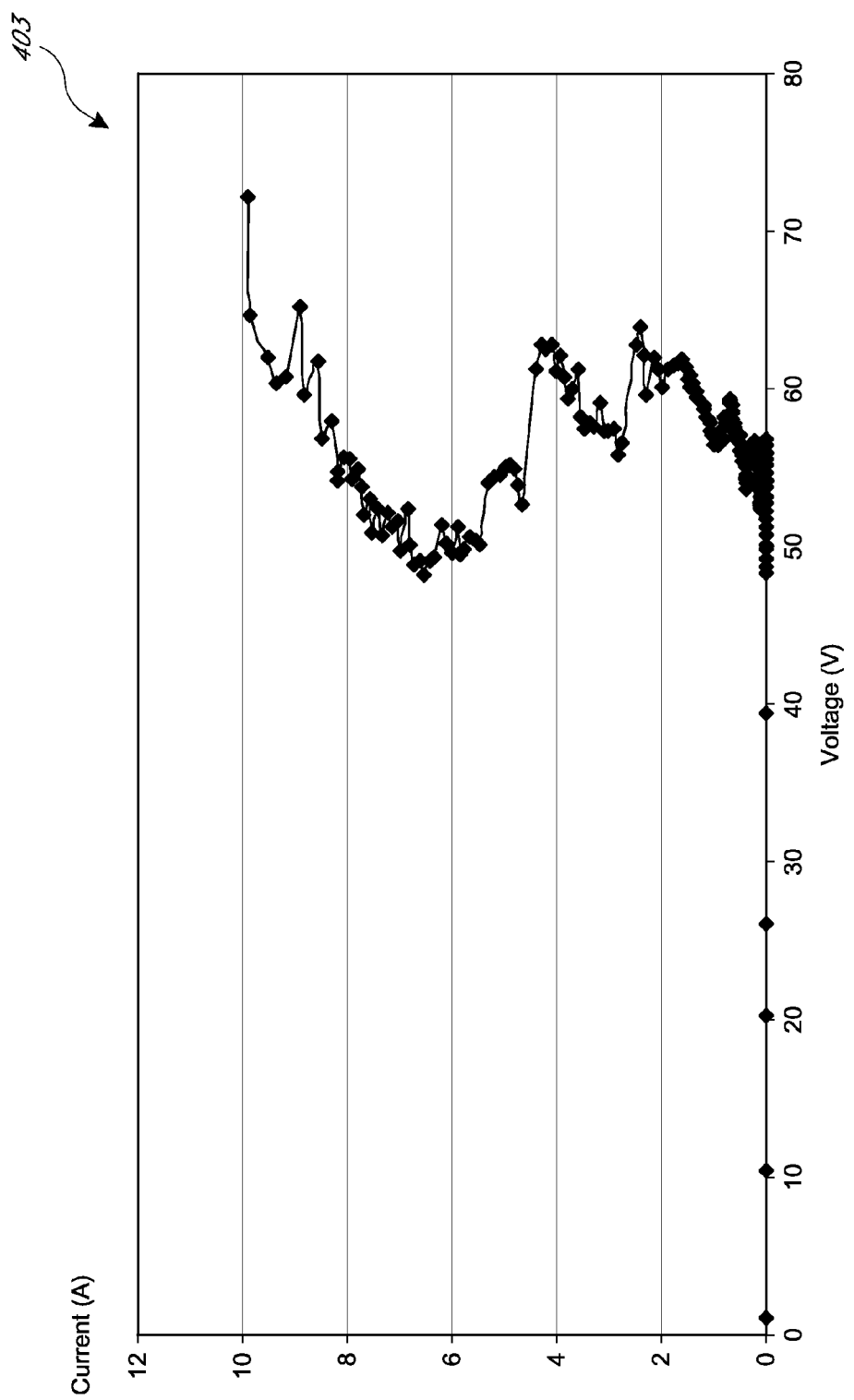
Figure 7D:
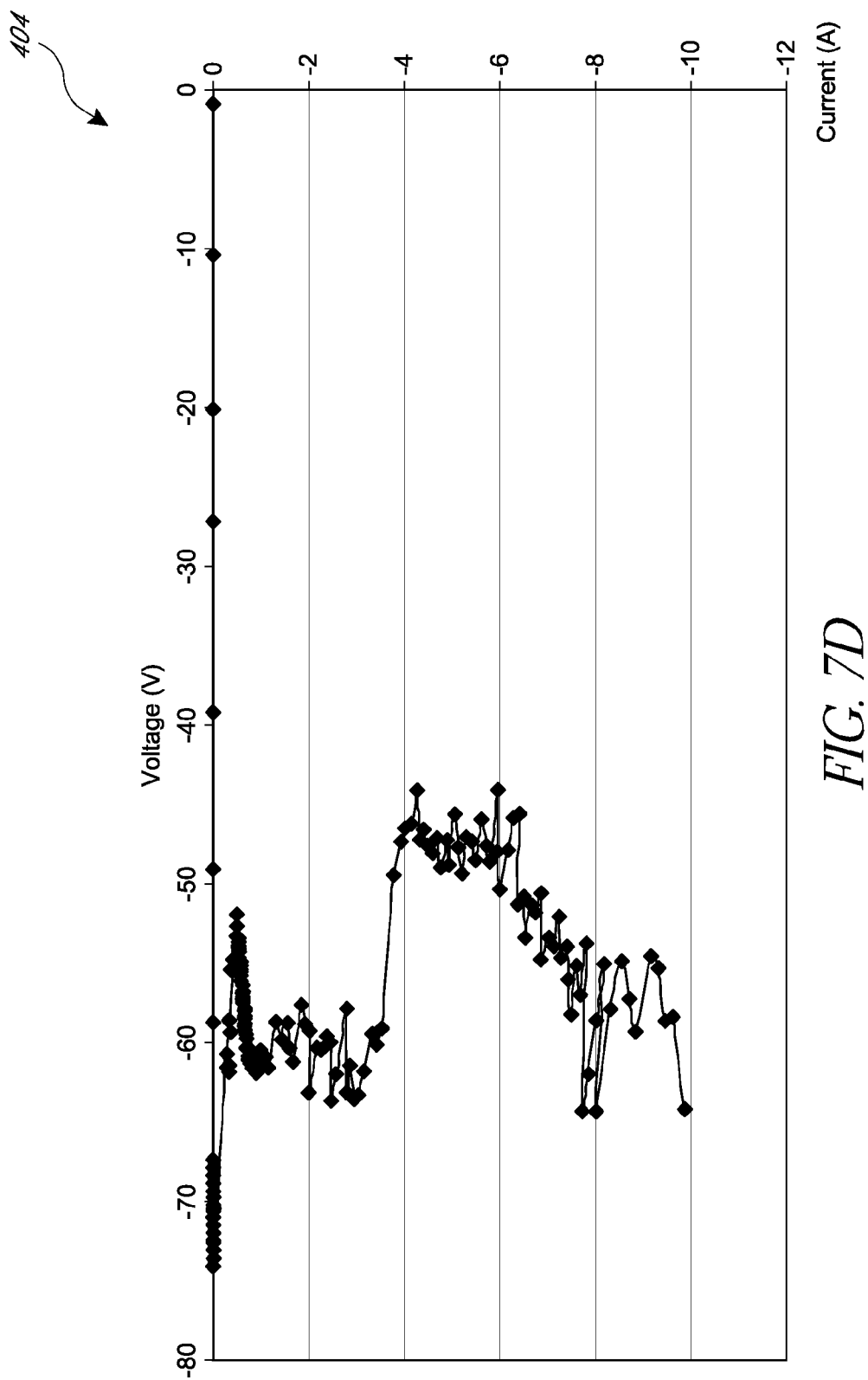

FIG. 7C is a graph 403 of TLP current-voltage characteristics of one embodiment of the blocking voltage device 100 of FIGS. 3A-3C, tested for a positive substrate stress condition between the anode terminal A and the ground terminal G. Additionally, FIG. 7D is a graph 404 of TLP current-voltage characteristics of one embodiment of the blocking voltage device 100 of FIGS. 3A-3C, tested for a negative substrate stress condition between the anode terminal A and the ground terminal G. As shown in FIGS. 7C and 7D, the blocking voltage device includes an NPNPN bidirectional SCR that can provide protection against overvoltage and undervoltage conditions between the anode and ground terminals.

As shown in FIGS. 7A-7D, the illustrated embodiment of a blocking voltage device has been configured to have a high current handling capability in excess of 9 Amps TLP for various stress conditions. For the various stress conditions, leakage current data was verified after application of each stress voltage to confirm the integrity of the high voltage blocking junction up to the maximum current depicted in the figures. As skilled artisans will appreciate, a relatively small variation in the leakage current value after each pulse can indicate the integrity of the IC. In contrast, drastic change in the leakage current can indicate IC damage.

Applications

Devices employing the above described schemes can be implemented into various high performance electronic devices and interface applications operating in harsh electrical environments. Examples of the electronic devices can include, but are not limited to, consumer electronic products, parts of the consumer electronic products, electronic test equipment, high robustness industrial and automotive applications, etc. Examples of the electronic devices can also include circuits of optical networks or other communication networks. The consumer electronic products can include, but are not limited to, an automobile, an engine control unit, a vehicle engine management controller, a transmission controller, a seatbelt controller, an anti-lock brake system controller, a camcorder, a camera, a digital camera, a portable memory chip, a washer, a dryer, a washer/dryer, a copier, a facsimile machine, a scanner, a multi functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
   a blocking voltage structure comprising:
   a first terminal;
   a second terminal, wherein the blocking voltage structure is configured to provide voltage blocking between the second terminal and the first terminal;
   a third terminal; and
   an integrated protection structure comprising:
      a silicon-controlled rectifier electrically connected between the first terminal and the second terminal, wherein the silicon-controlled rectifier is configured to protect the blocking voltage structure from overstress when a voltage of the second terminal increases relative to a voltage of the first terminal; and
      a bidirectional silicon-controlled rectifier electrically connected between the third terminal and the second terminal, wherein the bidirectional silicon-controlled rectifier is configured to protect the blocking voltage structure from overstress when a voltage of the third terminal increases relative to the voltage of the second terminal, and wherein the bidirectional silicon-controlled rectifier is further configured to protect the blocking voltage structure from overstress when the voltage of the second terminal increases relative to the voltage of the third terminal.

2. The apparatus of claim 1, wherein the blocking voltage structure comprises a blocking voltage diode.

3. The apparatus of claim 1, further comprising:
   a pad electrically connected to the first terminal;
   an interface control circuit; and
   an n-type double-diffused metal oxide semiconductor (NDMOS) transistor including a source and body electrically connected to a first power supply, a gate electrically connected to an output of the interface control circuit, and a drain electrically connected to the second terminal.

4. The apparatus of claim 1, further comprising:
   a pad;
   an interface control circuit;
   a p-type double-diffused metal oxide semiconductor (PDMOS) transistor including a source and body electrically connected to the second terminal, a gate electrically connected to an output of the interface control circuit, and a drain electrically connected to the pad.

5. The apparatus of claim 1, wherein the integrated protection structure further comprises:
   a first PNP bipolar transistor including an emitter electrically connected to the second terminal, a base, and a collector;
   a first NPN bipolar transistor including an emitter electrically connected to the first terminal, a base electrically connected to the collector of the first PNP bipolar transistor, and a collector electrically connected to the base of the first PNP bipolar transistor;
   a second NPN bipolar transistor including an emitter electrically connected to the third terminal, a base, and a collector; and
   a bidirectional PNP bipolar transistor including an emitter/collector electrically connected to the base of the second NPN bipolar transistor, a collector/emitter eclectically connected to the base of the first NPN bipolar transistor, and a base electrically connected to the collectors of the first and second NPN bipolar transistors,
   wherein the first PNP bipolar transistor and the first NPN bipolar transistor are configured to operate as the silicon-controlled rectifier, and
   wherein the first NPN bipolar transistor, the bidirectional PNP bipolar transistor, and the second NPN bipolar transistor are configured to operate as the bidirectional silicon-controlled rectifier.

6. The apparatus of claim 1, wherein the blocking voltage structure further comprises:
   a first p-type well comprising at least one p-type active region and at least one n-type active region electrically connected to the first terminal;
   a first n-type well comprising at least one p-type active region and at least one n-type active region electrically connected to the second terminal; and
   a second p-type well comprising at least one p-type active region and at least one n-type active region electrically connected to the third terminal; and
   an n-type isolation layer beneath the first p-type well, the first n-type well, and at least a portion of the second p-type well.

7. The apparatus of claim 6,
   wherein the at least one p-type active region of the first n-type well, the first n-type well, the first p-type well, and the at least one n-type active region of the first p-type well are configured to operate as the silicon-controlled rectifier, and
   wherein the at least one n-type active region of the first p-type well, the first p-type well, the n-type isolation layer, the second p-type well, and the at least one n-type active region of the second p-type well are configured to operate as the bidirectional silicon-controlled rectifier.

8. The apparatus of claim 7, wherein the blocking voltage structure comprises a blocking voltage diode, wherein the first p-type well and the first n-type well are configured to operate as the blocking voltage diode.

9. The apparatus of claim 6, wherein the blocking voltage structure is disposed in a p-type substrate, wherein the third terminal is configured to collect carriers injected into the p-type substrate when an electrostatic discharge event or electromagnetic interference event is received between the first terminal and the second terminal.

10. The apparatus of claim 6, wherein the first n-type well is configured to surround the first p-type well, and wherein the second p-type well is configured to surround the first n-type well.

11. The apparatus of claim 10, wherein the blocking voltage structure further comprises a second n-type well configured to surround the second p-type well, wherein the n-type isolation layer extends beneath the first p-type well, the first n-type well, the second p-type well, and at least a portion of the second n-type well.

12. The apparatus of claim 10, wherein the blocking voltage structure further comprises a first shallow n-type region and a second shallow n-type region, wherein the first shallow n-type region is disposed in the first n-type well between the first p-type well and the at least one n-type active region of the first n-type well, and wherein the second shallow n-type region is disposed in the first n-type well between the second p-type well and the at least one n-type active region of the first n-type well.

13. The apparatus of claim 12, wherein the at least one n-type active region of the first p-type well comprises a first n-type active region and a second n-type active region, and wherein the at least one p-type active region of the first p-type well comprises a first p-type active region disposed between the first and second n-type active regions.

14. The apparatus of claim 13, wherein the at least one n-type active region of the first n-type well comprises a third n-type active region and a fourth n-type active region, and wherein the at least one p-type active region of the first n-type well comprises a second p-type active region disposed between the third and fourth n-type active regions.

15. The apparatus of claim 10, wherein the at least one p-type active region of the first p-type well comprises a first p-type active region and a second p-type active region, and wherein the at least one n-type active region of the first p-type well comprises a first n-type active region disposed between the first and second p-type active regions.

16. The apparatus of claim 15, wherein the at least one p-type active region of the first n-type well comprises a third p-type active region and a fourth p-type active region, and wherein the at least one n-type active region of the first n-type well comprises a second n-type active region disposed between the third and fourth p-type active regions.

17. The apparatus of claim 16, wherein the at least one p-type active region of the second p-type well comprises a fifth p-type active region and a sixth p-type active region, and wherein the at least one n-type active region of the second p-type well comprises a third n-type active region disposed between the fifth and sixth p-type active regions.

18. The apparatus of claim 1, wherein the first terminal comprises an anode terminal, the second terminal comprises a cathode terminal, and the third terminal comprises a ground terminal.

19. An apparatus comprising:
a blocking voltage structure comprising:
a first terminal;
a second terminal, wherein the blocking voltage structure is configured to provide voltage blocking between the second terminal and the first terminal;
a third terminal; and
an integrated protection structure comprising:
a means for protecting the blocking voltage structure from overstress when a voltage of the second terminal increases relative to a voltage of the first terminal; and
a means for protecting the blocking voltage structure from overstress when a voltage of the third terminal increases relative to the voltage of the second terminal and protecting the blocking voltage structure from overstress when the voltage of the second terminal increases relative to the voltage of the third terminal.

20. An integrated circuit comprising:
a blocking voltage structure comprising:
a first p-type well comprising at least one p-type active region and at least one n-type active region electrically connected to a first terminal;
a first n-type well comprising at least one p-type active region and at least one n-type active region electrically connected to a second terminal;
a second p-type well comprising at least one p-type active region and at least one n-type active region electrically connected to a third terminal;
an n-type isolation layer beneath the first p-type well, the second n-type well, and at least a portion of the second p-type well; and
an integrated protection structure comprising:
a silicon-controlled rectifier associated with the at least one p-type active region of the first n-type well, the first n-type well, the first p-type well, and the at least one n-type active region of the first p-type well; and
a bidirectional silicon-controlled rectifier associated with the at least one n-type active region of the first p-type well, the first p-type well, the n-type isolation layer, the second p-type well, and the at least one n-type active region of the second p-type well.

21. The integrated circuit of claim 20, wherein the blocking voltage structure comprises a blocking voltage diode.

* * * * *